(12) United States Patent
Lai et al.

(10) Patent No.: US 12,324,228 B2
(45) Date of Patent: Jun. 3, 2025

(54) METHODS OF RESISTANCE AND CAPACITANCE REDUCTION TO CIRCUIT OUTPUT NODES

(71) Applicant: TAIWAN SEMICONDUCTOR MANUFACTURING CO., LTD., Hsinchu (TW)

(72) Inventors: Po-Chia Lai, Fremont, CA (US); Shang-Wei Fang, Hsinchu (TW); Meng-Hung Shen, Hsinchu County (TW); Jiann-Tyng Tzeng, Hsinchu (TW); Ting-Wei Chiang, New Taipei (TW); Jung-Chan Yang, Taoyuan (TW); Stefan Rusu, Sunnyvale, CA (US)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 449 days.

(21) Appl. No.: 17/720,184

(22) Filed: Apr. 13, 2022

(65) Prior Publication Data

US 2022/0238515 A1 Jul. 28, 2022

Related U.S. Application Data

(63) Continuation of application No. 16/787,964, filed on Feb. 11, 2020, now Pat. No. 11,309,311.

(51) Int. Cl.
| | | |
|---|---|---|
| *H10D 84/80* | (2025.01) | |
| *G06F 30/392* | (2020.01) | |
| *G06F 30/394* | (2020.01) | |
| *H01L 23/485* | (2006.01) | |
| *H01L 23/64* | (2006.01) | |
| *H10D 89/10* | (2025.01) | |

(52) U.S. Cl.
CPC ......... *H10D 84/811* (2025.01); *G06F 30/392* (2020.01); *G06F 30/394* (2020.01); *H01L 23/485* (2013.01); *H01L 23/642* (2013.01); *H01L 23/647* (2013.01); *H10D 89/10* (2025.01)

(58) Field of Classification Search
CPC ......... H01L 27/07–0738; H01L 23/485; H01L 27/0207; G06F 30/392
See application file for complete search history.

(56) References Cited

U.S. PATENT DOCUMENTS

| | | |
|---|---|---|
| 7,387,957 B2 | 6/2008 | Saito et al. |
| 8,507,957 B2 | 8/2013 | Hou et al. |
| 9,324,718 B2 | 4/2016 | Wu et al. |
| 9,653,394 B2 | 5/2017 | Lau et al. |

(Continued)

*Primary Examiner* — Evren Seven
*Assistant Examiner* — Cole Leon Lindsey
(74) *Attorney, Agent, or Firm* — Maschoff Brennan

(57) ABSTRACT

An integrated circuit is provided, including a first conductive pattern, at least one first conductive segment, and a first via. The first conductive pattern is disposed in a first layer and configured as a terminal of an inverter. The at least one first conductive segment is disposed in a second layer above the first layer and configured to transmit an output signal output from the inverter. The first via contacts the first conductive pattern and the at least one first conductive segment to transmit the output signal. An area, contacting the first conductive pattern, of the first via is smaller than an area, contacting the at least one first conductive segment, of the first via.

20 Claims, 12 Drawing Sheets

(56) References Cited

U.S. PATENT DOCUMENTS

| | | | |
|---|---|---|---|
| 9,817,103 B2 | 9/2017 | Kim et al. | |
| 9,911,627 B1 | 3/2018 | Or-Bach et al. | |
| 2015/0357282 A1* | 12/2015 | Lau .................... | H10D 84/83 |
| | | | 257/774 |
| 2019/0295940 A1* | 9/2019 | Liaw .................... | H10D 84/853 |

* cited by examiner

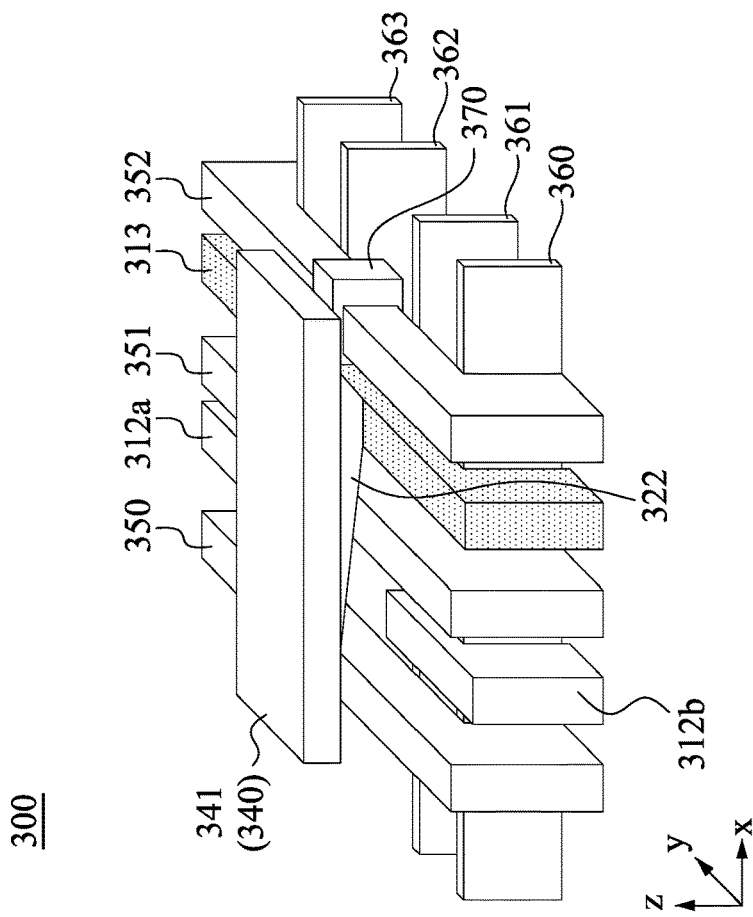
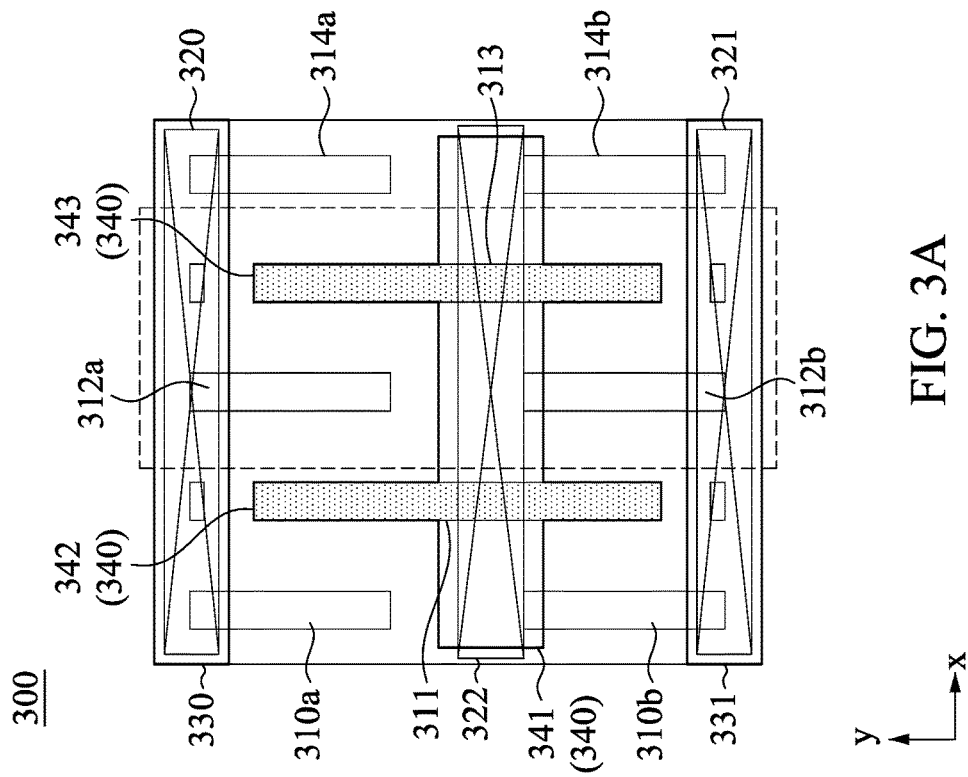
FIG. 3A
FIG. 3B

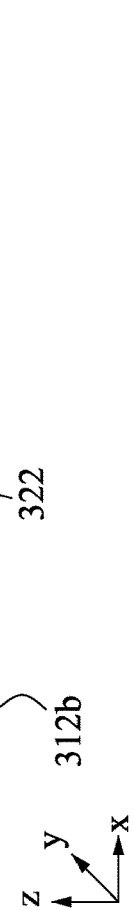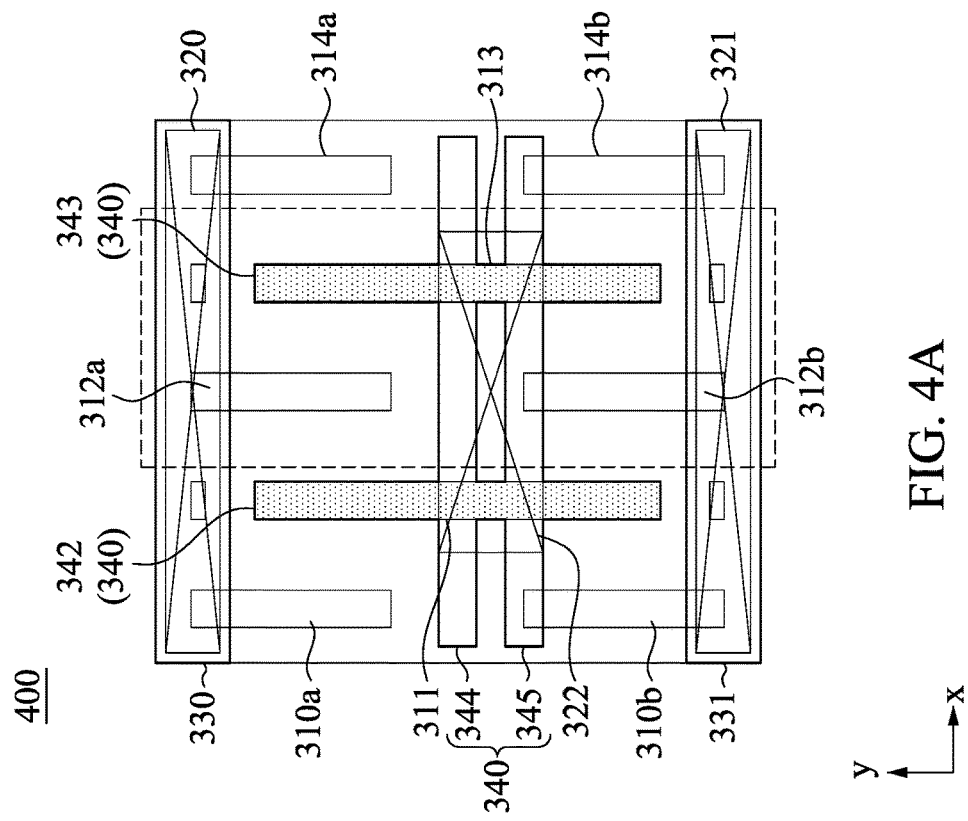
FIG. 4B
FIG. 4A

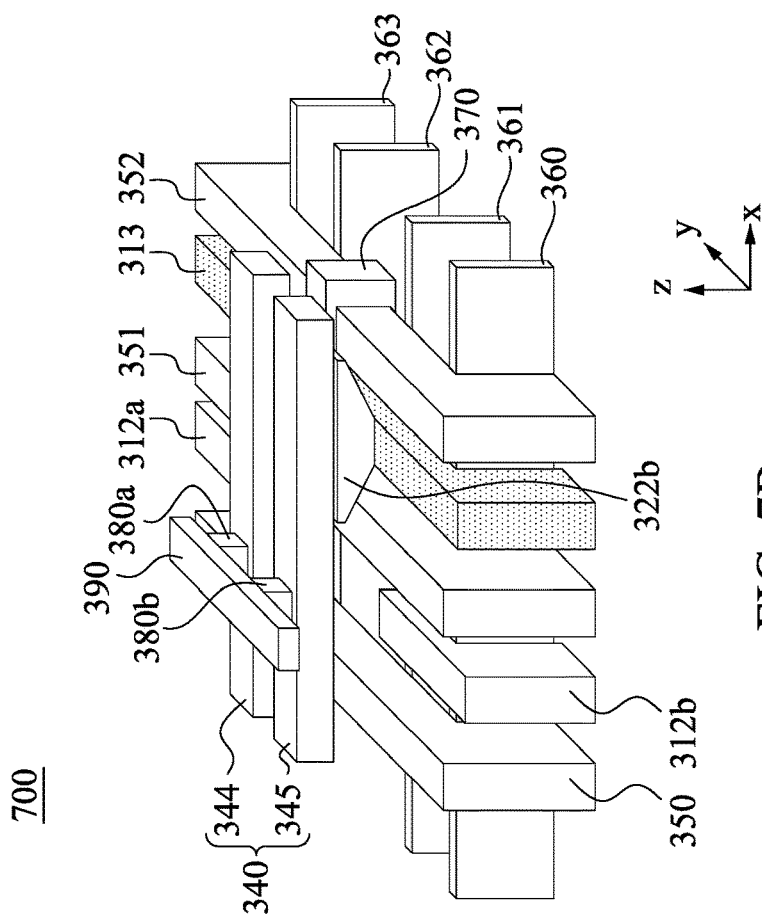
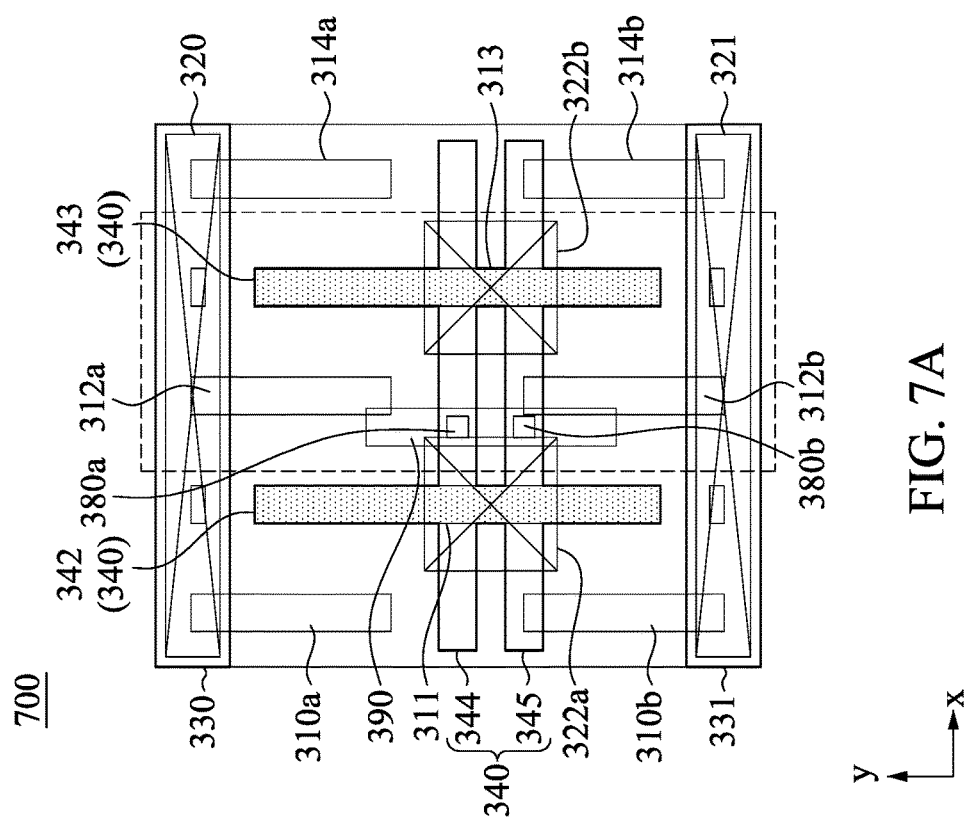
FIG. 7A
FIG. 7B

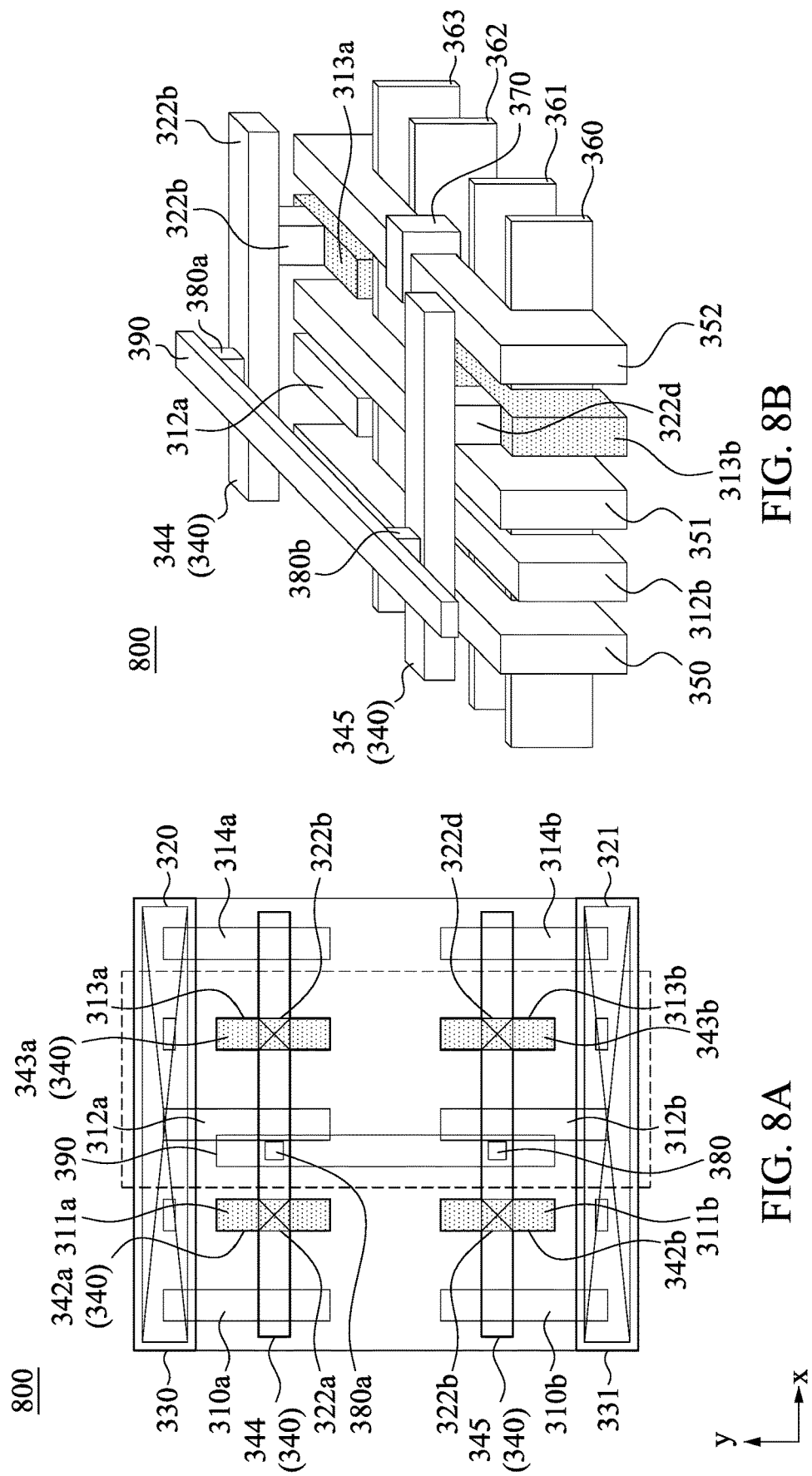

METHODS OF RESISTANCE AND CAPACITANCE REDUCTION TO CIRCUIT OUTPUT NODES

CROSS-REFERENCE

The present application is a continuation application of U.S. application Ser. No. 16/787,964, filed Feb. 11, 2020, now U.S. Pat. No. 11,309,311, issued Apr. 19, 2022, the full disclosures of which are incorporated herein by reference.

BACKGROUND

Integrated circuits have been widely used for various kinds of application, and the demand for faster processing speed and lower power consumption is increasing. However, internal resistance and capacitance influence the performance of the integrated circuit. Thus, optimization of the integrated circuit layout design including various layers of features, such as active regions, gate electrodes, and/or various layers of conductive structures, is achieved by several approaches.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 3A is a layout diagram in a plan view of a section of an integrated circuit, and FIG. 3B is a perspective diagram of the layout diagram of the integrated circuit in FIG. 3A, in accordance with various embodiments.

FIG. 4A is a layout diagram in a plan view of a section of an integrated circuit, and FIG. 4B is a perspective diagram of a section circled by a dashed line in the layout diagram of the integrated circuit in FIG. 4A, in accordance with various embodiments.

FIG. 7A is a layout diagram in a plan view of a section of an integrated circuit, and FIG. 7B is a perspective diagram of a section circled by a dashed line in the layout diagram of the integrated circuit in FIG. 7A, in accordance with various embodiments.

FIG. 8A is a layout diagram in a plan view of a section of an integrated circuit, and FIG. 8B is a perspective diagram of a section circled by a dashed line in the layout diagram of the integrated circuit in FIG. 8A, in accordance with various embodiments.

DETAILED DESCRIPTION

Figure 1:
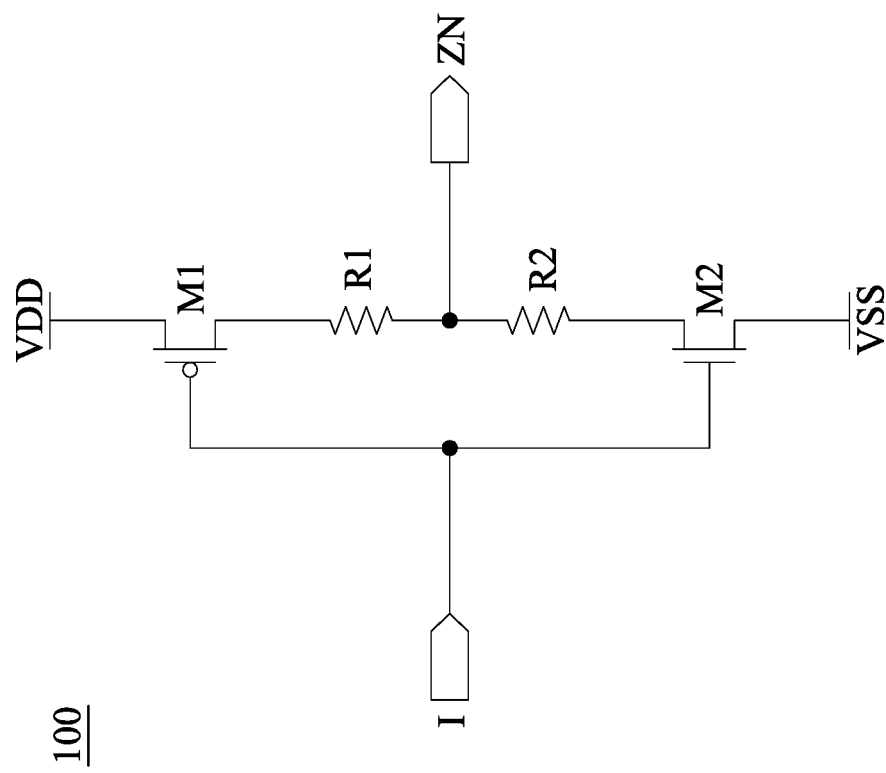
FIG. 1 is an equivalent circuit of a section of an integrated circuit, in accordance with various embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

The terms used in this specification generally have their ordinary meanings in the art and in the specific context where each term is used. The use of examples in this specification, including examples of any terms discussed herein, is illustrative only, and in no way limits the scope and meaning of the disclosure or of any exemplified term. Likewise, the present disclosure is not limited to various embodiments given in this specification.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. As used herein, the term "and/or" includes any and all combinations of one or more of the associated listed items.

As used herein, "around", "about", "approximately" or "substantially" shall generally refer to any approximate value of a given value or range, in which it is varied depending on various arts in which it pertains, and the scope of which should be accorded with the broadest interpretation understood by the person skilled in the art to which it pertains, so as to encompass all such modifications and similar structures. In some embodiments, it shall generally mean within 20 percent, preferably within 10 percent, and more preferably within 5 percent of a given value or range. Numerical quantities given herein are approximate, meaning that the term "around", "about", "approximately" or "substantially" can be inferred if not expressly stated, or meaning other approximate values.

Reference is now made to FIG. 1. FIG. 1 is an equivalent circuit of a section of an integrated circuit 100, in accordance with various embodiments. For illustration, the integrated circuit 100 includes transistors M1 and M2. One terminal of the transistor M1 is coupled to a power supply terminal VDD, and another terminal of the transistor M1 is coupled to an output node ZN through a resistor R1. One terminal of the transistor M2 is coupled to a power supply terminal VSS, and another terminal of the transistor M2 is coupled to the output node ZN through a resistor R2. A gate terminal of the transistor M1 and a gate terminal of the transistor M2 are coupled together at an input node I of the integrated circuit 100. In some embodiments, the integrated circuit 100 is a logic gate circuit including AND, OR, NAND, MUX, Flip-flop, Latch, BUFF or any other types of logic circuit. However, the scope of the disclosure is not intended to be limiting of the present disclosure.

In some embodiments, the transistor M1 is a P-type transistor, and the transistor M2 is an N-type transistor. The transistors M1 and M2 are formed by, for example, including multiple active areas, gate structures, and multiple conductive patterns (MDs) on a substrate. The details of the configuration of the transistors M1 and M2 will be discussed in the following paragraphs. However, the scope of the disclosure is not intended to be limited in the above-mentioned types, and other suitable arrangement of types of the transistors M1 and M2 are within the contemplated scope of the present disclosure.

In some embodiments, the resistor R1 represents the resistance contributed by the metal routing arranged to couple one terminal of the transistor M1 with the output node ZN. Similarly, the resistor R2 represents the resistance contributed by the metal routing arranged to couple one terminal of the transistor M2 with the output node ZN. The details of the configuration of the resistors R1 and R2 will be discussed in the following paragraphs.

Figure 2:
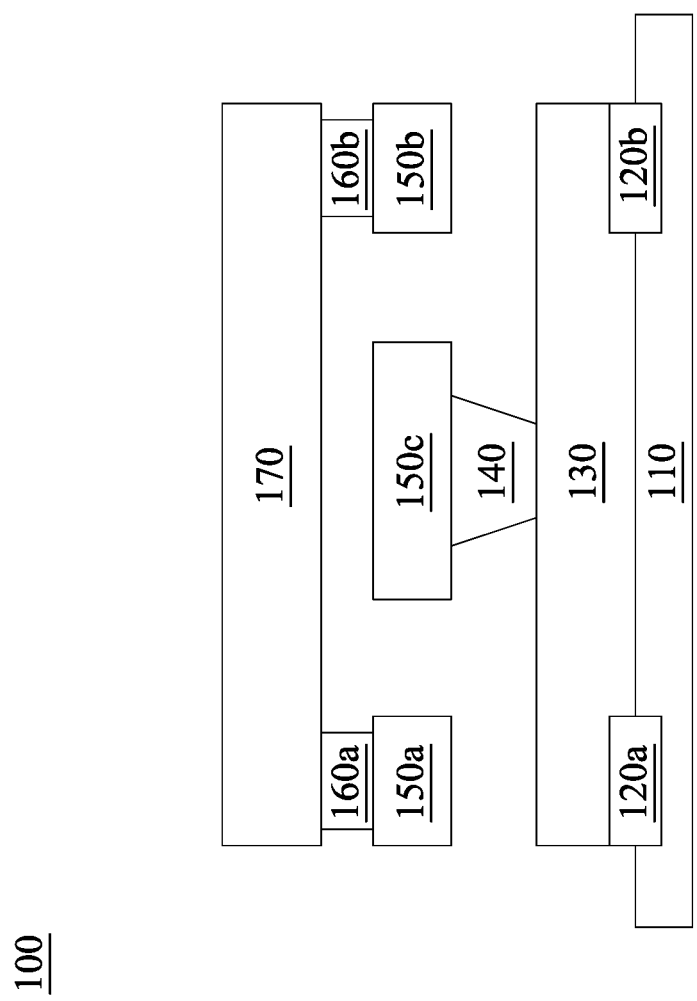
FIG. 2 is a cross-sectional view of part of the integrated circuit of FIG. 1, in accordance with various embodiments.

Reference is now made to FIG. 2. FIG. 2 is a cross-sectional view of part of the integrated circuit 100 of FIG. 1, in accordance with various embodiments. For illustration, the integrated circuit 100 includes a substrate 110, diffusion regions (or active regions) 120a-120b, a conductive pattern 130, a via 140, metal-zero (M0) segments 150a-150c, vias 160a-160b, and a metal-one (M1) segment 170. As shown in FIG. 2, the diffusion regions 120a-120b are formed in the substrate 110 with the conductive pattern 130 formed thereon. The via 140 is disposed and coupled between the conductive pattern 130 and the metal-zero segment 150c. The metal-zero segments 150a-150b are coupled to the metal-one segment 170 through the vias 160a-160b.

With reference to FIGS. 1 and 2, the diffusion regions 120a-120b are configured for the formation of the transistors M1 and M2, while the conductive pattern 130 corresponds to the terminals of the transistors M1 and M2 that are coupled at the output node ZN, in some embodiments. In such embodiments, the via 140, the metal-zero segments 150a-150c, the vias 160a-160b, and the metal-one segment 170 are included in the metal routing structure which contributes the resistance of the resistor R1 or R2. Accordingly, when the resistance generated by metal routing structure is reduced, the equivalent resistance of the resistor R1 or R2 is reduced correspondingly.

In some embodiments, the via 140 has a bottom surface contacting the conductive pattern 130, and an upper surface contacting the metal-zero segment 150c. For illustration, the upper surface of the via 140 is greater than the bottom surface of the via 140. In some embodiments, the via 140 includes a tapered shape with a width that decreases from a first width to a second width narrower than the first width. The shape of the via 140 is given for illustrative purposes. Various shapes of the via 140 that has a bottom surface and an upper surface greater than the bottom surface are within the contemplated scope of the present disclosure. For example, in various embodiments, the bottom surface of the via 140 is greater than the upper surface of the via 140.

The configuration of the elements in the integrated circuit 100 discussed above is given for illustrative purposes and can be modified depending on the actual implementations. The present disclosure is not limited thereto. For example, in some embodiments, a width of the conductive pattern 130 is narrower than a width of the upper surface of the via 140.

As discussed above, the via 140 has a larger contact area and interface between the metal-zero segment 150c and the conductive pattern 130, compared to some approaches. With the larger contact area of the via 140, the contact resistance corresponding to the via 140 is reduced accordingly. Because the metal routing structure includes the via 140, the resistance generated by the metal routing structure is reduced correspondingly. Accordingly, the equivalent resistance of the resistor R1 or R2 in FIG. 1, which is contributed by the metal routing structure, is reduced correspondingly.

In some approaches, the via associated with the resistor R1 or R2 in FIG. 1 includes an upper surface and a bottom surface with equal area to that of the upper surface, and a width of the via is the same as a width of a conductive pattern disposed under the via. Therefore, signals output from the output node pass very resistive signal paths that can slow down the speed and further influence the performance of the integrated circuit. Compared to the above approaches, with the configuration as discussed above in the embodiments of FIG. 2, the equivalent resistance of the resistor R1 or R2 in FIG. 1 can be reduced and, for example, about 5 to 6 times smaller than that in the above approaches.

Reference is now made to FIG. 3A. FIG. 3A is a layout diagram in a plan view of a section of an integrated circuit 300, in accordance with various embodiments. For illustration, as shown in FIG. 3A, the integrated circuit 300 includes conductive patterns 310a-310b, 311, 312a-312b, 313, 314a-314b, vias 320-322, power rail patterns 330-331, and a conductive segment 340. In some embodiments, the conductive patterns 310a-310b, 311, 312a-312b, 313, 314a-314b are in a metal over diffusion layer. The vias 320-322 are in a first via layer above the conductive pattern layer. The power rail patterns 330-331 are in a power rail layer above the first via layer. The conductive segment 340 is in a first conductive segment layer above the first via layer.

The conductive patterns 310a-310b, 311, 312a-312b, 313, 314a-314b are each configured with respect to, for example, the conductive pattern (MD) 130 of FIG. 2 For illustration, the conductive patterns 310a-310b, 311, 312a-312b, 313, 314a-314b extend in y direction. The conductive patterns 310a-310b, 311, 312a-312b, 313, 314a-314b are separated from each other in x direction that is different from y direction in a plan view. Furthermore, the conductive patterns 310a-310b, 312a-312b and 314a-314b are separated from each other in y direction.

The vias 320-322 are configured with respect to, for example, the vias 140 and 160a-160b of FIG. 2. For illustration, the vias 320-322 extend in x direction. The via 320 overlaps the conductive patterns 310a, 312a, and 314a. The via 321 overlaps the conductive patterns 310b, 312b, and 314b. The via 322 is interposed between the vias 320 and 321 and crosses the conductive patterns 311 and 313. In some embodiments, a ratio of a width to a length of the via 322 ranges from about 0.01 to about 100. In some embodiments, the vias 320-322 occupy the same area in a layout view.

In some embodiments, the conductive patterns 310a-310b, 312a-312b or 314a-314b are generated by removing a portion from a conductive pattern that is the same as the conductive patterns 311 and 313, in which the portion overlaps the via 322. However, the scope of the disclosure is not intended to be limited in the aforementioned arrangement of the conductive patterns 310a-310b, 312a-312b and 314a-314b, and other suitable kinds of the arrangement of the conductive patterns 310a-310b, 312a-312b and 314a-314b are within the contemplated scope of the present disclosure. For example, in some embodiments, the conductive patterns 310a-310b, 312a-312b and 314a-314b are generated separately.

The power rail patterns 330-331 are configured with respect to, for example, power rail patterns. For illustration, the power rail patterns 330-331 extend along the same direction as the vias 320 and 321 extend. The power rail patterns 330 overlaps the via 320, and the power rail patterns 331 overlaps the via 321. In some embodiments, the integrated circuit 300 receives the power supply voltages VDD and VSS through the power rail patterns 330-330 and the vias 320-321.

The conductive segment 340 is configured with respect to, for example, the metal-zero segment 150c of FIG. 2. For illustration, the conductive segment 340 includes a conductive portions 341-343. The conductive portion 341 extends in x direction and overlaps the via 322. In some embodiments, a ratio of a width, along y direction, of the conductive portion 341 to a width of the via 322 is about 1 to about 0.6. In various embodiments, a width of the conductive portion 341 along x direction is shorter than that of the via 322. However, the scope of the disclosure is not intended to be limited in the aforementioned arrangement of conductive segment 340, and other suitable kinds of the arrangement of the conductive segment 340 are within the contemplated scope of the present disclosure. For example, in alternative embodiments, the width of the conductive portion 341 of the conductive segment 340 along x direction is equal to or longer than that of the via 322. As shown in FIG. 3A, furthermore, the second conductive portions 342-343 extend in y direction and overlap the conductive patterns 311 and 313. In some embodiments, the second conductive portions 342-343 partially overlap the conductive patterns 311 and 313 in a plan view.

Furthermore, in some embodiments, a location of the output node ZN of the integrated circuit 300 corresponds to the center of the conductive segment 340, but the present disclosure is not limited thereto. The location of the output node ZN can be set at different locations based on the design of the integrated circuit 300.

Reference is now made to FIG. 3B. FIG. 3B is a perspective diagram of a section circled by a dashed line in the layout diagram of the integrated circuit 300 in FIG. 3A, in accordance with various embodiments. For illustration, as shown in FIG. 3B, the integrated circuit 300 includes the conductive patterns 312a-312b and 313, the via 322, and the conductive segment 340 (or the conductive portion 341) as shown in FIG. 3A. For simplicity of illustration, the material over diffusion patterns 310a-310b, 311, 314a, 314b, the vias 320-321, the power rail patterns 330-331, and the second conductive portions 342-343 are not shown in FIG. 3B.

In addition, as shown in FIG. 3B, the integrated circuit 300 further includes gates 350-352, active areas 360-363, and a cut layer 370. For illustration, the gates 350-352 cross over the active areas 360-363. The cut layer 370 is configure to be formed to cut the gate 352. Each one of the conductive patterns 312a-312b is arranged between two of the gates 350-352 and crosses over the active areas 360-363. The conductive segment 340 is disposed above the conductive patterns 312a-312b and 313 and the gates 350-352. The via 322 includes an upper area contacting the conductive segment 340 and a bottom area contacting the conductive pattern 313. The upper area of the via 322 is greater than the bottom area of the via 322. In some embodiments, the via 322 includes a first portion that is coupled to the conductive segment 340 and extends in x direction, and a second portion that is coupled to the conductive pattern 313. The via 322 also has a width which is the same as a width of the conductive pattern 313 along x direction. Moreover, as shown in FIG. 3B, the first portion of the via 322 overlaps the gates 350-352 and the conductive pattern 313, without overlapping the gate 350 the conductive pattern 312a and 312b.

With the configuration illustrated in FIGS. 3A and 3B, the sizeable contacting area of the via 322 between the conductive segment 340 and the conductive pattern 313 reduces the resistance generated by the metal routing structure, and accordingly, reduces the equivalent resistance of, for example, the resistor R1 or R2 in FIG. 1, as discussed above.

Moreover, in some embodiments, the vias 320-322 have similarly structure. Therefore, the resistance of the vias 320-322 has a substantially same resistance value. In various embodiments, the via 320-322 are fabricated with same materials.

The configuration of FIGS. 3A and 3B are given for illustrative purposes. Various configurations of the elements mentioned above in FIGS. 3A and 3B are within the contemplated scope of the present disclosure. For example, in various embodiments, the first portion of the via 322 overlaps one or both of the conductive patterns 312a-312b. In alternative embodiments, the conductive segment 340 is enlarged to have a larger area, compared to what is illustrated in FIG. 3A, which also reduces the resistance generated by the metal routing structure, and accordingly, reduces the equivalent resistance of, for example, the resistor R1 or R2 in FIG. 1.

Reference is now made to FIG. 4A. FIG. 4A is a layout diagram in a plan view of a section of an integrated circuit 400, in accordance with various embodiments. With respect to the embodiments of FIG. 4A, like elements in FIG. 3A are designated with the same reference numbers for ease of understanding. The specific operations of similar elements, which are already discussed in detail in above paragraphs, are omitted herein for the sake of brevity, unless there is a need to introduce the co-operation relationship with the elements shown in FIG. 4A.

Compared to the embodiment shown in FIG. 3A, instead of including the conductive portion 341, the conductive segment 340 includes conductive portions 344-345. For illustration, as shown in FIG. 4A, the conductive portions 344-345 are separated from each other in y direction and extend in x direction. The conductive portions 341 and 344 overlap the via 322. In some embodiments, a ratio of a width, along x direction, of the conductive portions 341 and 344 to a width of the via 322 is about 1.5 to about 1, and a ratio of a width, along y direction, of the conductive portions 341 and 344 to a width of the via 322 is about 1 to about 2.5. However, the configurations of FIG. 4A are given for the illustrative purpose, but the present disclosure is not limited thereto. Any suitable modification based on the actual implementation is within the scope of the present disclosure. For example, in some embodiments, only one of the conductive portions 341 and 344 overlaps the via 322. In various embodiments, the dimension ratio of the via 322 to the conductive portions 341 and 344 in a layout view is various according to the design of the integrated circuit.

Furthermore, in some embodiments, there are more suitable locations for the output node ZN in the integrated circuit 400 than that of the integrated circuit 300 shown in FIG. 3A. The location of the output node ZN can be either on the center of the conductive portion 341 or on the center of the conductive portion 345, but the present disclosure is not limited thereto. The location of the output node ZN can be set at different locations based on the design of the integrated circuit. With respect to the configurations of FIG. 4A, the flexibility is provided for the metal routing corresponding to the conductive portions 341-342, and smaller chip area and high performance is achieved in the integrated circuit.

Reference is now made to FIG. 4B. FIG. 4B is a perspective diagram of a section circled by a dashed line in the layout diagram of the integrated circuit 400 in FIG. 4A, in accordance with various embodiments. With respect to the embodiments of FIG. 4B, like elements in FIG. 3B are designated with the same reference numbers for ease of understanding. The specific operations of similar elements, which are already discussed in detail in above paragraphs, are omitted herein for the sake of brevity, unless there is a need to introduce the co-operation relationship with the elements shown in FIG. 4B.

Compared to the embodiment shown in FIG. 3B, as shown in FIG. 4B, instead of including the conductive portion 341, the conductive segment 340 of the integrated circuit 400 includes conductive portions 344-345. For illustration, the via 322 includes the first portion that is coupled to the conductive portions 344-345 and extends in x direction, and the second portion that is coupled to the conductive pattern 313 and has a width which is the same as a width of the conductive pattern 313 along x direction.

With the configuration illustrated in FIGS. 4A and 4B, the resistance generated by the separated conductive portions 344-345 is more significant than that of the conductive portion 341 having a merged segment shown in FIG. 3B. However, with respect to the embodiment shown in FIGS. 4A and 4B, the decoupling capacitance among the conductive patterns 311-313, the via 322, and the conductive segment 340 shown in FIG. 4A and FIG. 4B is less than that of the configuration in the embodiments shown in FIGS. 3A and 3B. As a result, the speed of the integrated circuit is improved overall.

The configuration of FIGS. 4A and 4B is given for illustrative purposes. Various configurations of the elements mentioned above in FIGS. 4A and 4B are within the contemplated scope of the present disclosure. For example, in some embodiments, the distance of the separated conductive portions 344-345 in y direction is various based on the actual implements of the present disclosure.

Figures 5A, 5B:
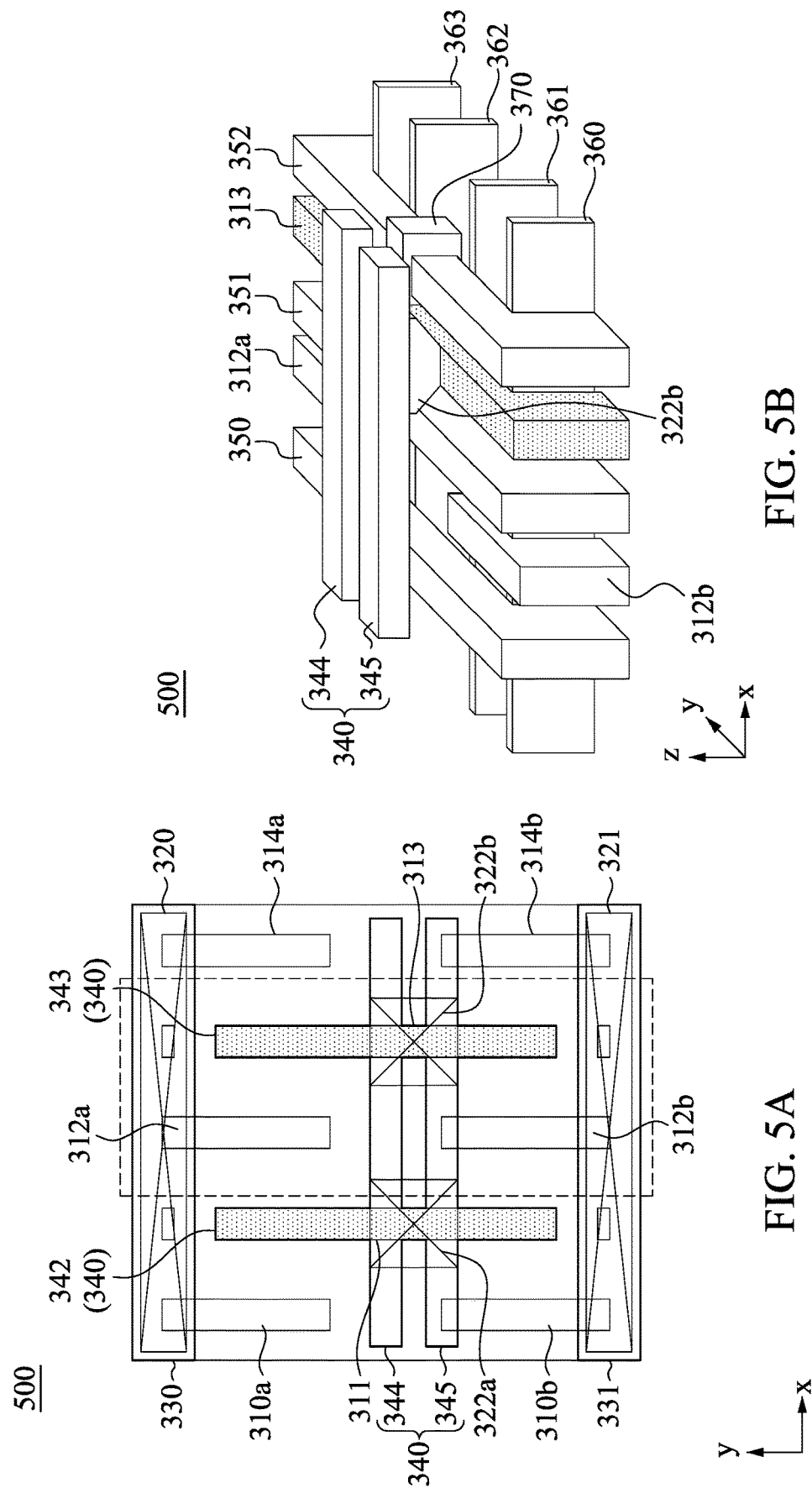
FIG. 5A is a layout diagram in a plan view of a section of an integrated circuit.
FIG. 5B is a perspective diagram of a section circled by a dashed line in the layout diagram of the integrated circuit in FIG. 5A, in accordance with various embodiments.

Reference is now made to FIG. 5A. FIG. 5A is a layout diagram in a plan view of a section of an integrated circuit 500, in accordance with various embodiments. With respect to the embodiments of FIG. 5A, like elements in FIG. 4A are designated with the same reference numbers for ease of understanding. The specific operations of similar elements, which are already discussed in detail in above paragraphs, are omitted herein for the sake of brevity, unless there is a need to introduce the co-operation relationship with the elements shown in FIG. 5A.

Compared to the embodiment shown in FIG. 4A, instead of including the via 322, the integrated circuit 500 includes vias 322a-322b. For illustration, as shown in FIG. 5A, the vias 322a-322b are separated from each other in x direction. The conductive portions 341 and 344 overlap the vias 322a-322b. Moreover, the vias 322a-322b include a portion with a square shape with a width larger than a width of any of the conductive patterns shown in FIG. 5A. In some embodiments, a ratio of the width of each of the vias 322a-322b to one of the conductive patterns shown in FIG. 5A is about 3 to about 1. However, the configuration of FIG. 5A is given for illustrative purposes, but the present disclosure is not limited thereto. Any suitable modification based on the actual implementation is within the scope of the present disclosure. For example, in some embodiments, the separated vias 322a-322b have the portions with shapes different from each other. In alternative embodiments, the vias 322a-322b are generated by removing a middle portion of the via 322 as shown in FIG. 4A. Alternatively, in various embodiments, the via 322 shown in FIG. 4A is generated by merging the vias 322a and 322b shown in FIG. 5A into one segment.

In some embodiments, the location of the output node ZN can be either on the center of the conductive portion 341 or on the center of the conductive portion 345. In some embodiments, the location of the output node ZN is located between the vias 322a-322b, But the present disclosure is not limited thereto. The location of the output node ZN can be set at different locations based on the design of the integrated circuit.

Reference is now made to FIG. 5B. FIG. 5B is a perspective diagram of a section circled by a dashed line in the layout diagram of the integrated circuit 500 in FIG. 5A, in accordance with various embodiments. With respect to the embodiments of FIG. 5B, like elements in FIG. 4B are designated with the same reference numbers for ease of understanding. The specific operations of similar elements, which are already discussed in detail in above paragraphs, are omitted herein for the sake of brevity, unless there is a need to introduce the co-operation relationship with the elements shown in FIG. 5B.

Compared to the embodiment shown in FIG. 4B, instead of including the via 322, the integrated circuit 500 includes the via 322b. For simplicity of illustration, the via 322a is omitted here. For illustration, the via 322b includes a first portion that is coupled to the conductive portions 341 and 344, and a second portion that is coupled to the conductive pattern 313, in which the first portion occupies a larger area than the area the second portion occupies.

With the configuration illustrated in FIGS. 5A and 5B, the implement of two-square via structure reduces the resistance generated by the metal routing structure, and accordingly, reduces the equivalent resistance of, for example, the resistor R1 or R2 in FIG. 1, as discussed above and coupling capacitance.

Furthermore, there are more suitable locations for the output node ZN in the integrated circuit 500 than that of the integrated circuit 300 shown in FIG. 3A. The location of the output node ZN can be either on the center of the conductive portion 344 or on the center of the conductive portion 345, but the present disclosure is not limited thereto. The location of the output node ZN can be set at different locations based on the design of the integrated circuit. With respect to the configurations of FIG. 5A and FIG. 5B, the flexibility is provided for the metal routing corresponding to the conductive portions 341-345, and smaller chip area and high performance is achieved in the integrated circuit.

The configuration of FIGS. 5A and 5B are given for illustrative purposes. Various configurations of the elements mentioned above in FIGS. 5A and 5B are within the contemplated scope of the present disclosure. For example, in some embodiments, the middle part of the conductive portions 341 and 344 are merged into one segment for lower resistance.

Figures 6A, 6B:
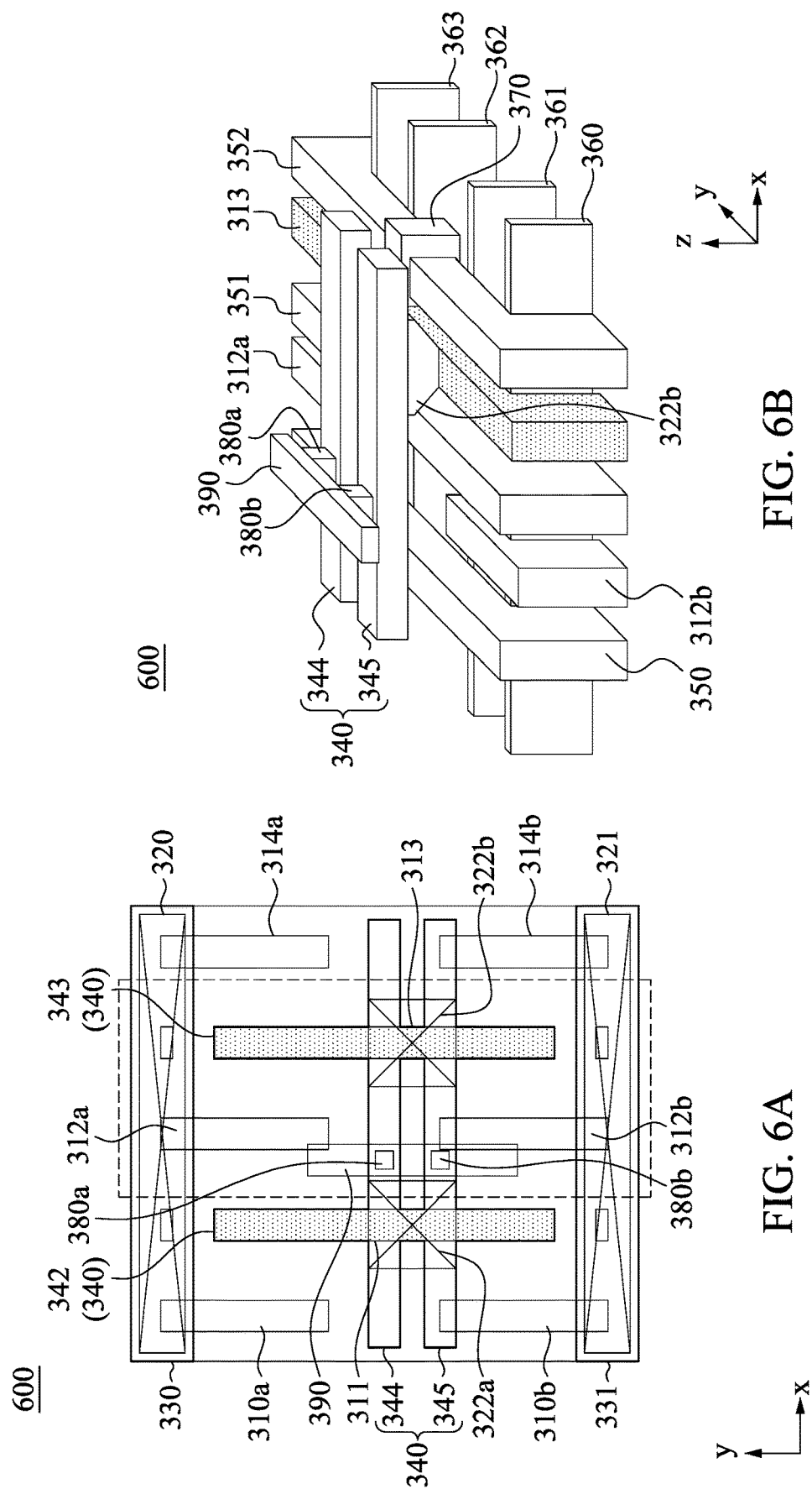
FIG. 6A is a layout diagram in a plan view of a section of an integrated circuit.
FIG. 6B is a perspective diagram of a section circled by a dashed line in the layout diagram of the integrated circuit in FIG. 6A, in accordance with various embodiments.

Reference is now made to FIG. 6A. FIG. 6A is a layout diagram in a plan view of a section of an integrated circuit 600, in accordance with various embodiments. With respect to the embodiments of FIG. 6A, like elements in FIG. 5A are designated with the same reference numbers for ease of understanding. The specific operations of similar elements, which are already discussed in detail in above paragraphs, are omitted herein for the sake of brevity, unless there is a need to introduce the co-operation relationship with the elements shown in FIG. 6A.

Compared to the embodiment shown in FIG. 5A, the integrated circuit 600 further includes vias 380a-380b and a conductive segment 390. In some embodiments, the vias 380a-380b are in a second via layer above the first conductive segment layer. The conductive segment 390 is in a second conductive segment layer above the second via layer. The vias 380a-380b are configured with respect to, for example, the vias 160a-160b of FIG. 2. The conductive segment 390 is configured with respect to, for example, the metal-one segment 170 of FIG. 2. For illustration, the conductive segment 390 extends in y direction and overlaps the vias 380a-380b. Each of the vias 380a-380b overlaps at least one of the conductive portions 341 and 344.

Furthermore, in some embodiments, a location of the output node ZN of the integrated circuit 600 corresponds to the center of the conductive segment 390, rather than corresponds to the conductive segment 340 as shown in previous embodiments. Therefore, in some embodiments of IC layout design process, the vias 380a-380b and the conductive segment 390 are included in a cell for the automatic place and route (APR) tools to utilize without independently considering the effective resistance and capacitance of the vias and the metal-one segment.

Reference is now made to FIG. 6B. FIG. 6B is a perspective diagram of a section circled by a dashed line in the layout diagram of the integrated circuit 600 in FIG. 6A, in accordance with various embodiments. With respect to the embodiments of FIG. 6B, like elements in FIG. 5B are designated with the same reference numbers for ease of understanding. The specific operations of similar elements, which are already discussed in detail in above paragraphs, are omitted herein for the sake of brevity, unless there is a need to introduce the co-operation relationship with the elements shown in FIG. 6B.

Compared to the embodiment shown in FIG. 5B, integrated circuit 600 further includes the vias 380a-380b and the conductive segment 390. For illustration, the vias 380a is coupled between the conductive portion 341 and the conductive segment 390. The vias 380b is coupled between the conductive portion 344 and the conductive segment 390.

The configuration of FIGS. 6A and 6B are given for illustrative purposes. Various configurations of the elements mentioned above in FIGS. 6A and 6B are within the contemplated scope of the present disclosure. For example, in some embodiments, the conductive segment 390 overlaps at least one of the vias 322a-322b, and thus, the vias 380a-380b overlap the at least one of the vias 322a-322b.

Reference is now made to FIG. 7A. FIG. 7A is a layout diagram in a plan view of a section of an integrated circuit 700, in accordance with various embodiments. With respect to the embodiments of FIG. 7A, like elements in FIG. 6A are designated with the same reference numbers for ease of understanding. The specific operations of similar elements, which are already discussed in detail in above paragraphs, are omitted herein for the sake of brevity, unless there is a need to introduce the co-operation relationship with the elements shown in FIG. 7A.

Compared to the embodiment shown in FIG. 6A, the vias 322a-322b are enlarged. In some embodiments, the vias 322a-322b shown in FIG. 7A have a square shape. However, in various embodiments, the vias 322a-322b have different shapes.

Reference is now made to FIG. 7B. FIG. 7B is a perspective diagram of a section circled by a dashed line in the layout diagram of the integrated circuit 700 in FIG. 7A, in accordance with various embodiments. With respect to the embodiments of FIG. 7B, like elements in FIG. 6B are designated with the same reference numbers for ease of understanding. The specific operations of similar elements, which are already discussed in detail in above paragraphs, are omitted herein for the sake of brevity, unless there is a need to introduce the co-operation relationship with the elements shown in FIG. 7B.

Compared to the embodiment shown in FIG. 6B, the via 322b is enlarged. In some embodiments, the via 322b in FIG. 7B has a portion occupying an area greater than that of the via 322b shown in FIG. 6B.

Furthermore, with the configurations illustrated in FIGS. 7A and 7B, in some embodiments, the larger contacting area of the via 322b, compared with the via 322b shown in FIG. 6A and FIG. 6B, reduces the resistance generated by the metal routing structure, and accordingly, reduces the equivalent resistance of, for example, the resistor R1 or R2 in FIG. 1, as discussed above.

The configuration of FIGS. 7A and 7B are given for illustrative purposes. Various configurations of the elements mentioned above in FIGS. 7A and 7B are within the contemplated scope of the present disclosure. For example, in some embodiments, the vias 322a-322b are enlarged along y direction. Alternately stated, the vias 322a-322b have a portion having rectangular figure.

Reference is now made to FIG. 8A. FIG. 8A is a layout diagram in a plan view of a section of an integrated circuit 800, in accordance with various embodiments. With respect to the embodiments of FIG. 8A, like elements in FIG. 7A are designated with the same reference numbers for ease of understanding. The specific operations of similar elements, which are already discussed in detail in above paragraphs, are omitted herein for the sake of brevity, unless there is a need to introduce the co-operation relationship with the elements shown in FIG. 8A.

Compared with the embodiment shown in FIG. 7A, instead of including the conductive patterns 311 and 313, the vias 322a-322b, and the second conductive portions 342-343, the integrated circuit 800 includes conductive patterns 311a-311b and 313a-313b, vias 322c-322f, and conductive portions 342a-342b and 343a-343b. For illustration, the conductive patterns 311a-311b, 313a-313b are separated from each other along y direction. The conductive portion 344 overlaps the vias 322c and 322e, and the conductive portion 345 overlaps the vias 322d and 322f. The conductive portions 342a-342b are separated from each other along y direction. The conductive portions 343a-343b are separated from each other along y direction. Moreover, in some embodiments, a width of the vias 322c-322f is equal to a width of the conductive patterns 311a-311b and 313a-313b, and another width of the vias 322c-322f is equal to a width of the conductive portions 344-345.

The scope of the disclosure is not intended to be limited in the aforementioned arrangement of FIG. 8A, and other suitable kinds of the arrangement are within the contemplated scope of the present disclosure. For example, in some embodiments, the conductive patterns 311a-311b and 313a-313b occupy a larger area than that occupied by the conductive portions 342a-342b and 343a-343b.

Reference is now made to FIG. 8B. FIG. 8B is a perspective diagram of a section circled by a dashed line in the layout diagram of the integrated circuit 800 in FIG. 8A, in accordance with various embodiments. With respect to the embodiments of FIG. 8B, like elements in FIG. 7B are designated with the same reference numbers for ease of understanding. The specific operations of similar elements, which are already discussed in detail in above paragraphs, are omitted herein for the sake of brevity, unless there is a need to introduce the co-operation relationship with the elements shown in FIG. 8B.

Compared with the embodiment shown in FIG. 7B, instead of including the conductive pattern 313, and the via 322b, the integrated circuit 800 includes the conductive patterns 313a-313b and the vias 322e-322f. For illustration, the via 322e is coupled between the conductive pattern 313a and the conductive portion 344, and the via 322f is coupled between the conductive pattern 313b and the conductive portion 345. The vias 322e-322f have an upper area contacting one of the conductive portions 344-345, and a bottom area contacting one of the conductive patterns 313a-313b. In some embodiments, the upper area of the vias 322e-322f and the bottom area of the vias 322e-322f occupy equal area.

The configuration of FIG. 8A and FIG. 8B are given for illustrative purposes. Various configurations of the elements mentioned above in FIG. 8A and FIG. 8B are within the contemplated scope of the present disclosure. For example, in some embodiments, a distance between the conductive patterns 311a-331b, a distance between the vias 322c-322d, and 322e-322f, and a distance between the conductive portions 342a-342b, and 343a-343b in in y direction are various based on the actual implements of the present disclosure.

Figure 9A:
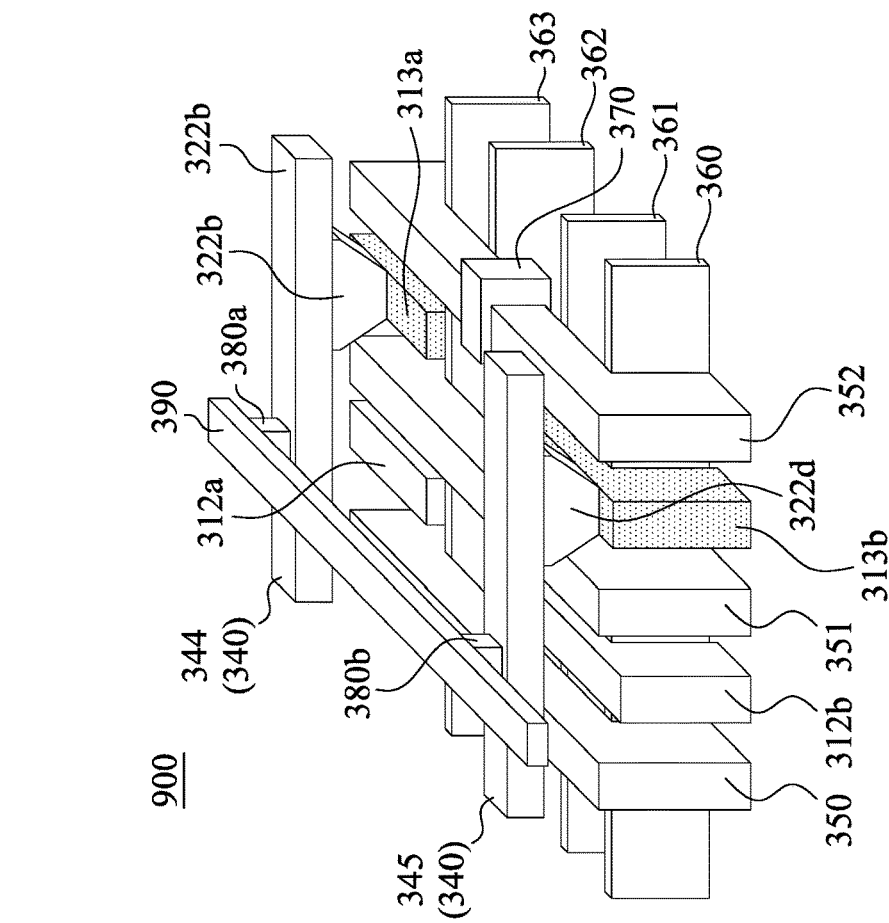
FIG. 9A is a layout diagram in a plan view of a section of an integrated circuit.

Reference is now made to FIG. 9A. FIG. 9A is a layout diagram in a plan view of a section of an integrated circuit 900, in accordance with various embodiments. With respect to the embodiments of FIG. 9A, like elements in FIG. 8A are designated with the same reference numbers for ease of understanding. The specific operations of similar elements, which are already discussed in detail in above paragraphs, are omitted herein for the sake of brevity, unless there is a need to introduce the co-operation relationship with the elements shown in FIG. 9A.

Compared with the embodiment shown in FIG. 8A, the vias 322c-322f occupy an area greater than the vias 322c-322f shown in FIG. 8A. For example, in some embodiments, the vias 322c-322f have a portion extend in x direction. However, in some embodiments, the vias 322c-322f have a portion extend in y direction. The embodiments as above are given for illustrative purposes, but the present disclosure is not limited thereto.

Figure 9B:
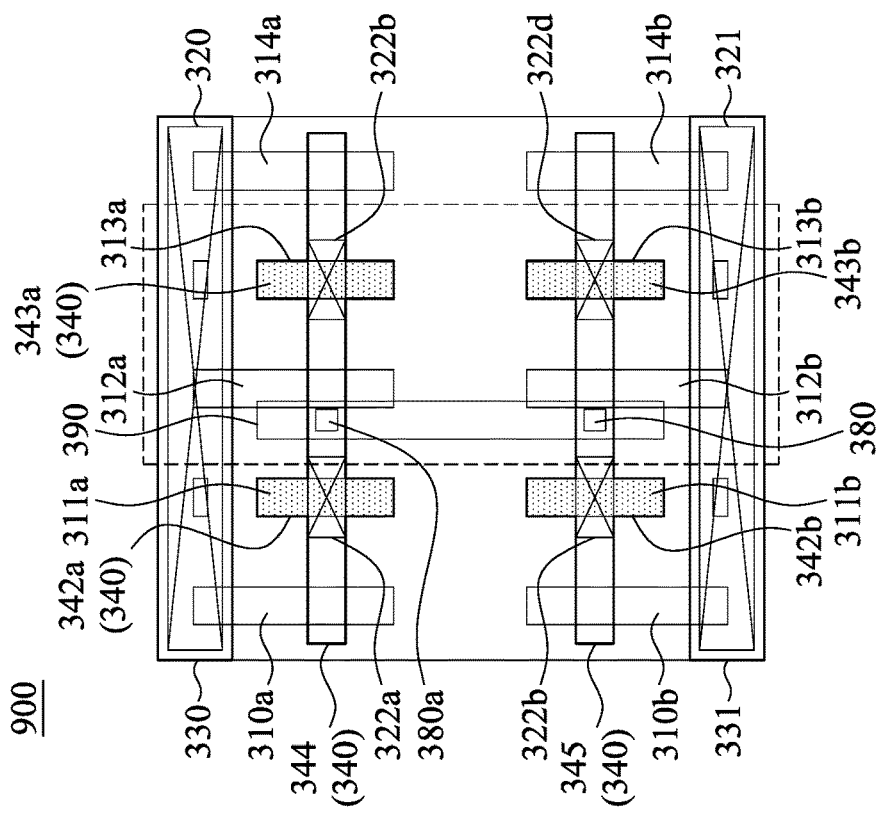
FIG. 9B is a perspective diagram of the layout diagram of a section circled by a dashed line in the layout diagram of the integrated circuit in FIG. 9A, in accordance with various embodiments.

Reference is now made to FIG. 9B. FIG. 9B is a perspective diagram of a section circled by a dashed line in the layout diagram of the integrated circuit 900 in FIG. 9A, in accordance with various embodiments. With respect to the embodiments of FIG. 9B, like elements in FIG. 8B are designated with the same reference numbers for ease of understanding. The specific operations of similar elements, which are already discussed in detail in above paragraphs, are omitted herein for the sake of brevity, unless there is a need to introduce the co-operation relationship with the elements shown in FIG. 9B.

Compared with the embodiment shown in FIG. 8B, for illustration, the upper area of the vias 322e-322f is greater than the bottom area of the vias 322e-322f. In some embodiments, the upper area of the vias 322e-322f extend are overlap at least one of the gates 351-352 in a plan view. Moreover, in various embodiments, the upper area of the vias 322e-322f overlap at least one of the conductive pattern 312a-312b. The embodiments as above are given for illustrative purposes, but the present disclosure is not limited thereto.

With the configuration as shown in FIG. 9B, the resistance of the vias 322b and 322d is lower than that of the vias 322b and 322d as shown in FIG. 8B. With the configuration illustrated in FIGS. 9A and 9B, the larger contacting area of the vias 322e-322f between the conductive segment 340 and the conductive patterns 313a-313b, compared with that of the vias 322e-322f shown in FIGS. 8A and 8B, reduces the resistance generated by the metal routing structure, and accordingly, reduces the equivalent resistance of, for example, the resistor R1 or R2 in FIG. 1, as discussed above.

The configuration of FIGS. 9A and 9B are given for illustrative purposes. Various configurations of the elements mentioned above in FIGS. 9A and 9B are within the contemplated scope of the present disclosure. For example, in some embodiments, the vias 322c-322f are enlarged along both x and y directions.

Furthermore, as discussed above, in some embodiments in FIGS. 2-9B, the vias configured with respect to, for example, the via 140 of FIG. 2, including the via 322, and vias 322a-322d, have a width that is in a range from the widths of the conductive patterns 311 (including 311a, 311b) and 313 (including 313a, 313b) to the widths of the conductive segment 340 along x direction.

Figure 10:
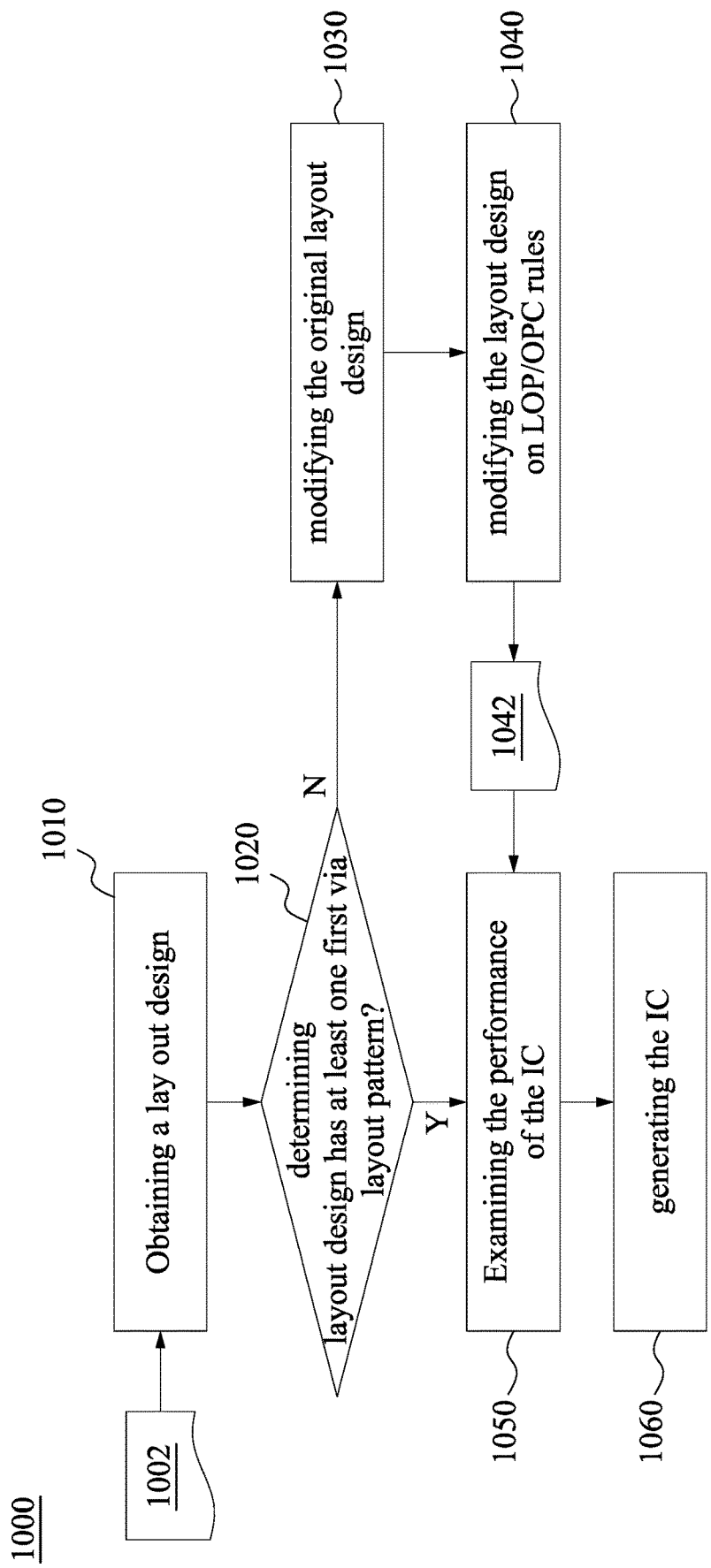
FIG. 10 is a flow chart of a method of generating a layout design for fabricating the integrated circuit, in accordance with some embodiments of the present disclosure.

In order to generate a layout design to fabricate an integrated circuit including the configurations as discussed above, a method is provided in the present disclosure as shown in FIG. 10. FIG. 10 is a flow chart of a method 1000 of generating a layout design for fabricating an integrated circuit, in accordance with some embodiments of the present disclosure. In some embodiments, the layout design described in method 1000 is generated based on a modified layout design as illustrated in conjunction with FIGS. 3A-9B. Other methods for generating the layout design based on the modified layout design illustrated in conjunction with FIGS. 3A-9B and/or other modified layout design are within the contemplated scope of the present disclosure.

The method 1000 includes exemplary operations as follows, but the operations of the method 1000 are not necessarily performed in the order described. The order of the operations disclosed in the method 1000 are able to be changed, or the operations are able to be executed simultaneously or partially simultaneously as appropriate, in accordance with the spirit and scope of various embodiments of the present disclosure. Furthermore, additional operations may be performed before, during, and/or after the method 1000, and some other operations may only be briefly described herein.

In operation 1010, an original layout design 1002 is obtained. In some embodiments, original layout design 1002 is stored in a computer readable, non-transitory storage device. In some embodiments, the original layout design 1002 is stored in a format compatible with a Graphic Database System (GDS) format or a GDSII format.

In operation 1020, determining whether the original layout design 1002, corresponding to an output node of an integrated circuit, has at least one first via is performed. The at least one first via includes, for example, vias 322 and 322a-322f as illustrated in conjunction with FIG. 3A, FIG. 4A, FIG. 5A, FIG. 6A, FIG. 7A, FIG. 8A and/or FIG. 9A. If the original layout design 1002 does not include the at least one first via, the operation 1030 is performed. Conversely, if the original layout design 1002 includes the at least one first via, the operation 1050 is performed.

The aforementioned operation 1020 is given for illustrative purposes. Various arrangement of operation 1020 are within the contemplated scope of the present disclosure. For example, additional operations can be included in operation 1020. In some embodiments, the operation 1020 includes determining whether a via coupled to the output node of the integrated circuit and a via coupled to the power rail pattern have the same configuration.

In operation 1030, the original layout design 1002 is modified in response to the result of operation 1020. The modification to the original layout design 1002 includes replacing at least one original via with the at least one first via, in which the at least one first via has a portion overlapping an area greater than that of the at least one original via; and in response to replacing, adjusting at least one first conductive segment (i.e., the conductive segment 340) that is above the at least one first via, and a plurality of conductive patterns (i.e., one or more of the conductive patterns 310-314b) that are below the at least one first via. The modified layout design includes one or more layout pattern modifications as illustrated in conjunction FIG. 3A, FIG. 4A, FIG. 5A, FIG. 6A, FIG. 7A, FIG. 8A and/or FIG. 9A.

In addition, in some embodiments shown in FIG. 5A, FIG. 6A and FIG. 7A, the adjusting the at least one first conductive segment includes, for example, generating at least two merged conductive patterns based on at least two of the plurality of conductive patterns, in which the at least two merged conductive patterns extend in the first direction (i.e., y direction) and overlap at least two of the plurality of conductive portion layout patterns (i.e., the conductive portions 342-3); and replacing the at least two of the plurality of conductive patterns with the at least two merged conductive patterns. The first via pattern and the second via pattern overlap the at least two merged conductive patterns.

Furthermore, in various embodiments, the operation of replacing the at least one original via with the at least one first via includes, for example, applying a ratio of a width of the portion of the at least one first via over a width of the at least one first conductive segment, in which the ratio ranges from about 0.6 to about 2.5 as discussed with respect to the above embodiments.

The aforementioned operation 1030 is given for illustrative purposes. Various arrangement of operation 1030 are within the contemplated scope of the present disclosure. For example, operation 1030 further includes, for example, before the operation of modifying the original layout design 1002, extracting from the original layout design 1002 a netlist N1 of the integrated circuit is performed. In some embodiments, the netlist N1 corresponds to, for example, the components (i.e., the conductive patterns) and connections in the original layout design 1002.

Moreover, in some embodiments, in operation 1030, that a simulation on the netlist N1 of the integrated circuit is performed, and the result of simulation is stored for further applications.

In operation 1040, the original layout design 1002 is further modified based on one or more design rules, logical operation (LOP) rules and/or optical proximity correction (OPC) rules. The modified original layout design is stored in a computer readable, non-transitory storage device as a modified layout design 1042. In some embodiments, modified layout design 1042 is stored in a format compatible with a Graphic Database System (GDS) format or a GDSII format.

In some embodiments, operations 1010, 1020, 1030, and 1040 are performed by an LOP tool, and operations 1020 and 1030 are thus performed in conjunction with performing an LOP on the original layout design. In some embodiments, operations 1010, 1020, 1030, and 1040 are performed by an OPC tool, and operations 1020 and 1030 are thus performed in conjunction with performing an OPC on the original layout design. In some embodiments, operations 1020 and 1030 are performed by executing a software tool different from the LOP tool or the OPC tool.

In operation 1050, a netlist N2 extracted from the modified layout design 1042 is simulated, and based on the results of the simulation of the netlists N1 and N2, examining the performance of the integrated circuit corresponding to the modified layout design 1042 is performed. In some embodiments, the examination is performed by comparing the parameters, for example, including, the resistance of the output node, the capacitance, and the overall operation speed between the results of the simulation of the netlists N1 and N2, but the present disclosure is not limited thereto.

Furthermore, in some embodiments, if the result of the simulation of the netlist N2 shows better performance, for example, the processing speed of the integrated circuit based on the netlist N2 is 3% faster than that of the integrated circuit based on the netlist N1, operation 1060 is performed. Conversely, if the result of the simulation of the netlist N1 shows better performance, at least one in operation 1030 is performed.

In operation 1060, the integrated circuit based on the modified layout design 1042 is generated. In some embodiments, at least one element of the integrated circuit based on the modified layout design is generated.

As discussed above, in some embodiments, the method 1000 generates the layout design which includes the following operations: generating at least one first via layout pattern (i.e., the via 322); generating at least one first conductive segment layout pattern (i.e., the conductive patterns 311, 313) that is above the at least one first via layout pattern; and generating a plurality of conductive layout patterns (i.e., the conductive segment 341) that are below the at least one first via layout pattern and extend along a first direction (i.e., y direction), in which along a second direction (i.e., x direction) different from the first direction, a width of the at least one first via layout pattern is in a range from widths of the plurality of conductive layout patterns to a width of the at least one first conductive segment layout pattern.

Figure 11:
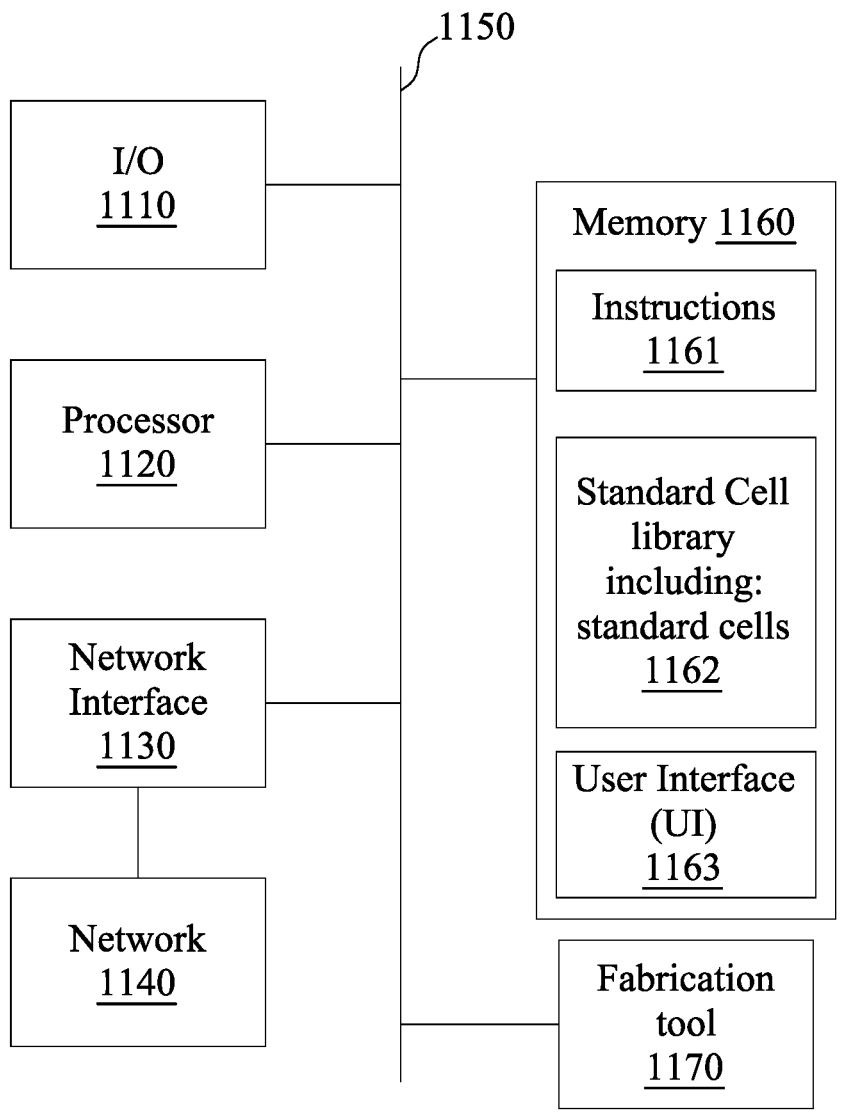
FIG. 11 is a block diagram of a system for designing the integrated circuit layout design, in accordance with some embodiments of the present disclosure.

Reference is now made to FIG. 11. FIG. 11 is a block diagram of an electronic design automation (EDA) system 1100 for designing the integrated circuit layout design, in accordance with some embodiments of the present disclosure. EDA system 1100 is configured to implement one or more operations of the method 1000 disclosed in FIG. 10, and further explained in conjunction with FIGS. 3A-9B. In some embodiments, EDA system 1100 includes an APR system.

In some embodiments, EDA system 1100 is a general purpose computing device including a hardware processor 1120 and a non-transitory, computer-readable storage medium 1160. Storage medium 1160, amongst other things, is encoded with, i.e., stores, computer program code (instructions) 1161, i.e., a set of executable instructions. Execution of instructions 1161 by hardware processor 1120 represents (at least in part) an EDA tool which implements a portion or all of, e.g., the method 1000.

The processor 1120 is electrically coupled to computer-readable storage medium 1160 via a bus 1150. The processor 1120 is also electrically coupled to an I/O interface 1110 and an fabrication tool 1170 by bus 1150. A network interface 1130 is also electrically connected to processor 1120 via bus 1150. Network interface 1130 is connected to a network 1140, so that processor 1120 and computer-readable storage medium 1160 are capable of connecting to external elements via network 1140. The processor 1120 is configured to execute computer program code 1161 encoded in computer-readable storage medium 1160 in order to cause EDA system 1100 to be usable for performing a portion or all of the noted processes and/or methods. In one or more embodiments, processor 1120 is a central processing unit (CPU), a multi-processor, a distributed processing system, an application specific integrated circuit (ASIC), and/or a suitable processing unit.

In one or more embodiments, computer-readable storage medium 1160 is an electronic, magnetic, optical, electromagnetic, infrared, and/or a semiconductor system (or apparatus or device). For example, computer-readable storage medium 1160 includes a semiconductor or solid-state memory, a magnetic tape, a removable computer diskette, a random access memory (RAM), a read-only memory (ROM), a rigid magnetic disk, and/or an optical disk. In one or more embodiments using optical disks, computer-readable storage medium 1160 includes a compact disk-read only memory (CD-ROM), a compact disk-read/write (CD-R/W), and/or a digital video disc (DVD).

In one or more embodiments, storage medium 1160 stores computer program code 1161 configured to cause EDA system 1100 (where such execution represents (at least in part) the EDA tool) to be usable for performing a portion or all of the noted processes and/or methods. In one or more embodiments, storage medium 1160 also stores information which facilitates performing a portion or all of the noted processes and/or methods. In one or more embodiments, storage medium 1160 stores library 1162 of standard cells including such standard cells as disclosed herein, for example, a cell including transistors M1-M2 discussed above with respect to FIG. 1.

EDA system 1100 includes I/O interface 1110. I/O interface 1110 is coupled to external circuitry. In one or more embodiments, I/O interface 1110 includes a keyboard, keypad, mouse, trackball, trackpad, touchscreen, and/or cursor direction keys for communicating information and commands to processor 1120.

EDA system 1100 also includes network interface 1130 coupled to processor 1120. Network interface 1130 allows EDA system 1100 to communicate with network 1140, to which one or more other computer systems are connected. Network interface 1130 includes wireless network interfaces such as BLUETOOTH, WIFI, WIMAX, GPRS, or WCDMA; or wired network interfaces such as ETHERNET, USB, or IEEE-1364. In one or more embodiments, a portion or all of noted processes and/or methods, is implemented in two or more systems 1100.

EDA system 1100 also includes the fabrication tool 1170 coupled to processor 1120. The fabrication tool 1170 is configured to fabricate integrated circuits, e.g., the integrated circuit 100 illustrated in FIG. 1, according to the design files processed by the processor 1120.

EDA system 1100 is configured to receive information through I/O interface 1110. The information received through I/O interface 1110 includes one or more of instructions, data, design rules, libraries of standard cells, and/or other parameters for processing by processor 1120. The information is transferred to processor 1120 via bus 1150. EDA system 1100 is configured to receive information related to a UI through I/O interface 1110. The information is stored in computer-readable medium 1160 as user interface (UI) 1163.

In some embodiments, a portion or all of the noted processes and/or methods is implemented as a standalone software application for execution by a processor. In some embodiments, a portion or all of the noted processes and/or methods is implemented as a software application that is a part of an additional software application. In some embodiments, a portion or all of the noted processes and/or methods is implemented as a plug-in to a software application. In some embodiments, at least one of the noted processes and/or methods is implemented as a software application that is a portion of an EDA tool. In some embodiments, a portion or all of the noted processes and/or methods is implemented as a software application that is used by EDA system 1100. In some embodiments, a layout diagram which includes standard cells is generated using a tool such as VIRTUOSO® available from CADENCE DESIGN SYSTEMS, Inc., or another suitable layout generating tool.

In some embodiments, the processes are realized as functions of a program stored in a non-transitory computer readable recording medium. Examples of a non-transitory computer readable recording medium include, but are not limited to, external/removable and/or internal/built-in storage or memory unit, for example, one or more of an optical disk, such as a DVD, a magnetic disk, such as a hard disk, a semiconductor memory, such as a ROM, a RAM, a memory card, and the like.

Figure 12:
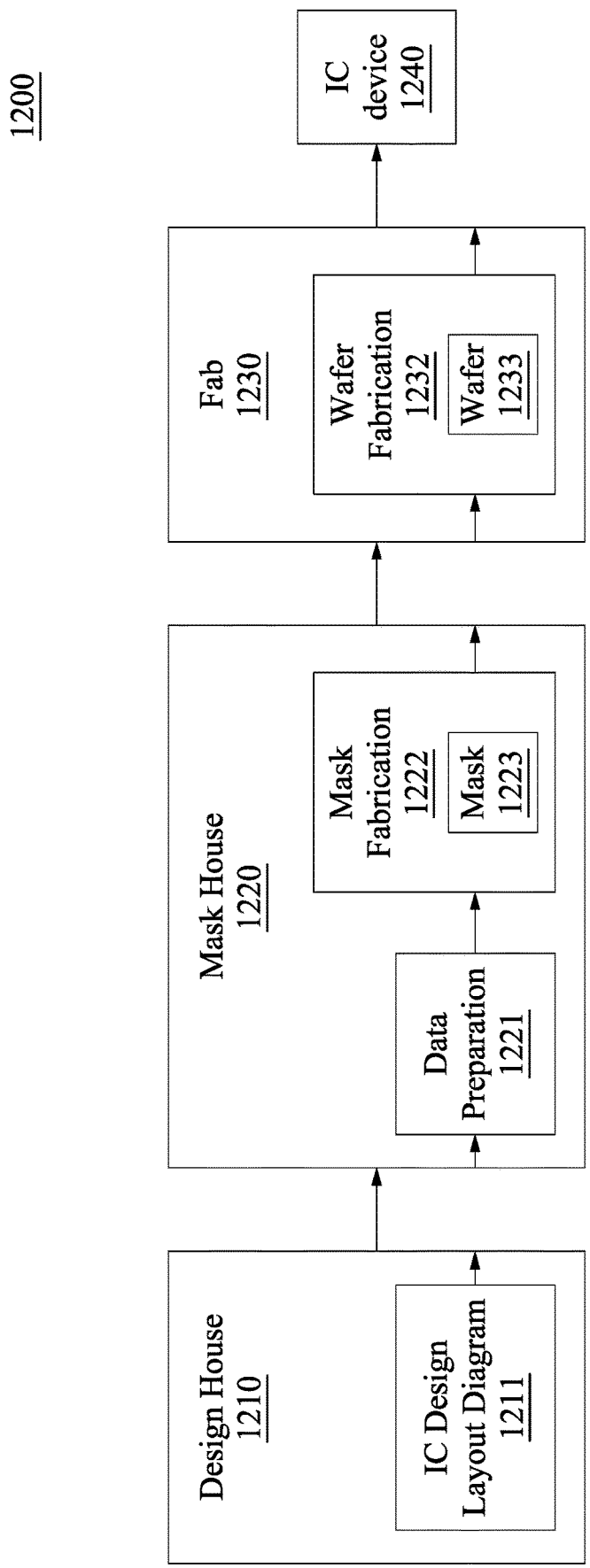
FIG. 12 is a block diagram of an integrated circuit manufacturing system, and an integrated circuit manufacturing flow associated therewith, in accordance with some embodiments.

FIG. 12 is a block diagram of IC manufacturing system 1200, and an IC manufacturing flow associated therewith, in accordance with some embodiments. In some embodiments, based on a layout diagram, at least one of (A) one or more semiconductor masks or (B) at least one component in a layer of a semiconductor integrated circuit is fabricated using IC manufacturing system 1200.

In FIG. 12, IC manufacturing system 1200 includes entities, such as a design house 1210, a mask house 1220, and an IC manufacturer/fabricator ("fab") 1230, that interact with one another in the design, development, and manufacturing cycles and/or services related to manufacturing an IC device 1240. The entities in IC manufacturing system 1200 are connected by a communications network. In some embodiments, the communications network is a single network. In some embodiments, the communications network is a variety of different networks, such as an intranet and the Internet. The communications network includes wired and/or wireless communication channels. Each entity interacts with one or more of the other entities and provides services to and/or receives services from one or more of the other entities. In some embodiments, two or more of design house 1210, mask house 1220, and IC fab 1230 is owned by a single larger company. In some embodiments, two or more of design house 1210, mask house 1220, and IC fab 1230 coexist in a common facility and use common resources.

Design house (or design team) 1210 generates an IC design layout diagram 1211. IC design layout diagram 1211 includes various geometrical patterns, for example, an IC layout design depicted in FIG. 3A, FIG. 4A, FIG. 5A, FIG. 6A, FIG. 7A, FIG. 8A and/or FIG. 9A, designed for an IC device 1240, for example, integrated circuits 300, 400, 500, 600, 700, 800, and 900, discussed above with respect to FIG. 3A, FIG. 4A, FIG. 5A, FIG. 6A, FIG. 7A, FIG. 8A and/or FIG. 9A. The geometrical patterns correspond to patterns of metal, oxide, or semiconductor layers that make up the various components of IC device 1240 to be fabricated. The various layers combine to form various IC features. For example, a portion of IC design layout diagram 1211 includes various IC features, such as an active region, gate electrode, source and drain, conductive segments or vias of an interlayer interconnection, to be formed in a semiconductor substrate (such as a silicon wafer) and various material layers disposed on the semiconductor substrate. Design house 1210 implements a proper design procedure to form IC design layout diagram 1211. The design procedure includes one or more of logic design, physical design or place and route. IC design layout diagram 1211 is presented in one or more data files having information of the geometrical patterns. For example, IC design layout diagram 1211 can be expressed in a GDSII file format or DFII file format.

Mask house 1220 includes data preparation 1221 and mask fabrication 1222. Mask house 1220 uses IC design layout diagram 1211 to manufacture one or more masks 1223 to be used for fabricating the various layers of IC device 1240 according to IC design layout diagram 1211. Mask house 1220 performs mask data preparation 1221, where IC design layout diagram 1211 is translated into a representative data file ("RDF"). Mask data preparation 1221 provides the RDF to mask fabrication 1222. Mask fabrication 1222 includes a mask writer. A mask writer converts the RDF to an image on a substrate, such as a mask (reticle) 1223 or a semiconductor wafer 1233. The IC design layout diagram 1211 is manipulated by mask data preparation 1221 to comply with particular characteristics of the mask writer and/or requirements of IC fab 1230. In FIG. 12, data preparation 1221 and mask fabrication 1222 are illustrated as separate elements. In some embodiments, data preparation 1221 and mask fabrication 1222 can be collectively referred to as mask data preparation.

In some embodiments, data preparation 1221 includes optical proximity correction (OPC) which uses lithography enhancement techniques to compensate for image errors, such as those that can arise from diffraction, interference, other process effects and the like. OPC adjusts IC design layout diagram 1211. In some embodiments, data preparation 1221 includes further resolution enhancement techniques (RET), such as off-axis illumination, sub-resolution assist features, phase-shifting masks, other suitable techniques, and the like or combinations thereof. In some embodiments, inverse lithography technology (ILT) is also used, which treats OPC as an inverse imaging problem.

In some embodiments, data preparation 1221 includes a mask rule checker (MRC) that checks the IC design layout diagram 1211 that has undergone processes in OPC with a set of mask creation rules which contain certain geometric and/or connectivity restrictions to ensure sufficient margins, to account for variability in semiconductor manufacturing processes, and the like. In some embodiments, the MRC modifies the IC design layout diagram 1211 to compensate for limitations during mask fabrication 1222, which may undo part of the modifications performed by OPC in order to meet mask creation rules.

In some embodiments, data preparation 1221 includes lithography process checking (LPC) that simulates processing that will be implemented by IC fab 1230 to fabricate IC device 1240. LPC simulates this processing based on IC design layout diagram 1211 to create a simulated manufactured device, such as IC device 1240. The processing parameters in LPC simulation can include parameters associated with various processes of the IC manufacturing cycle, parameters associated with tools used for manufacturing the IC, and/or other aspects of the manufacturing process. LPC takes into account various factors, such as aerial image contrast, depth of focus ("DOF"), mask error enhancement factor ("MEEF"), other suitable factors, and the like or combinations thereof. In some embodiments, after a simulated manufactured device has been created by LPC, if the simulated device is not close enough in shape to satisfy design rules, OPC and/or MRC are be repeated to further refine IC design layout diagram 1211.

It should be understood that the above description of data preparation 1221 has been simplified for the purposes of clarity. In some embodiments, data preparation 1221 includes additional features such as a logic operation (LOP) to modify the IC design layout diagram 1211 according to manufacturing rules. Additionally, the processes applied to IC design layout diagram 1211 during data preparation 1221 may be executed in a variety of different orders.

After data preparation 1221 and during mask fabrication 1222, a mask 1223 or a group of masks 1223 are fabricated based on the modified IC design layout diagram 1211. In some embodiments, mask fabrication 1222 includes performing one or more lithographic exposures based on IC design layout diagram 1211. In some embodiments, an electron-beam (e-beam) or a mechanism of multiple e-beams is used to form a pattern on a mask (photomask or reticle) 1223 based on the modified IC design layout diagram 1211. Mask 1223 can be formed in various technologies. In some embodiments, mask 1223 is formed using binary technology. In some embodiments, a mask pattern includes opaque regions and transparent regions. A radiation beam, such as an ultraviolet (UV) beam, used to expose the image sensitive material layer (for example, photoresist) which has been coated on a wafer, is blocked by the opaque region and transmits through the transparent regions. In one example, a binary mask version of mask 1223 includes a transparent substrate (for example, fused quartz) and an opaque material (for example, chromium) coated in the opaque regions of the binary mask. In another example, mask 1223 is formed using a phase shift technology. In a phase shift mask (PSM) version of mask 1223, various features in the pattern formed on the phase shift mask are configured to have proper phase difference to enhance the resolution and imaging quality. In various examples, the phase shift mask can be attenuated PSM or alternating PSM. The mask(s) generated by mask fabrication 1222 is used in a variety of processes. For example, such a mask(s) is used in an ion implantation process to form various doped regions in semiconductor wafer 1233, in an etching process to form various etching regions in semiconductor wafer 1233, and/or in other suitable processes.

IC fab 1230 includes wafer fabrication 1232. IC fab 1230 is an IC fabrication business that includes one or more manufacturing facilities for the fabrication of a variety of different IC products. In some embodiments, IC Fab 1230 is a semiconductor foundry. For example, there may be a manufacturing facility for the front end fabrication of a plurality of IC products (front-end-of-line (FEOL) fabrication), while a second manufacturing facility may provide the back end fabrication for the interconnection and packaging of the IC products (back-end-of-line (BEOL) fabrication), and a third manufacturing facility may provide other services for the foundry business.

IC fab 1230 uses mask(s) 1223 fabricated by mask house 1220 to fabricate IC device 1240. Thus, IC fab 1230 at least indirectly uses IC design layout diagram 1211 to fabricate IC device 1240. In some embodiments, semiconductor wafer 1233 is fabricated by IC fab 1230 using mask(s) 1223 to form IC device 1240. In some embodiments, the IC fabrication includes performing one or more lithographic exposures based at least indirectly on IC design layout diagram 1211. Semiconductor wafer 1233 includes a silicon substrate or other proper substrate having material layers formed thereon. Semiconductor wafer 1233 further includes one or more of various doped regions, dielectric features, multilevel interconnects, and the like (formed at subsequent manufacturing steps).

An integrated circuit is provided, including a first conductive pattern, at least one first conductive segment, and a first via. The first conductive pattern is disposed in a first layer and configured as a terminal of an inverter. The at least one first conductive segment is disposed in a second layer above the first layer and configured to transmit an output signal output from the inverter. The first via contacts the first conductive pattern and the at least one first conductive segment to transmit the output signal. An area, contacting the first conductive pattern, of the first via is smaller than an area, contacting the at least one first conductive segment, of the first via. In some embodiments, the integrated circuit further includes multiple active areas that extend in a first direction and are crossed over by the first conductive pattern The at least one first conductive segment extends in the first direction, and the first conductive pattern extends in a second direction perpendicular to the first direction. In some embodiments, the first via includes a portion extending in the second direction and crossing over the first conductive pattern in a layout view. In some embodiments, the at least one first conductive segment includes multiple first conductive segments that overlap the first conductive pattern in a layout view and extend in a first direction. The integrated circuit further includes a second conductive segment extending in a second direction above the first conductive segments and coupled to the first conductive segments to transmit the output signal. In some embodiments, the area, contacting the first conductive segments, of the first via has a square shape. In some embodiments, the at least one first conductive segment includes multiple first conductive segments that overlap the first conductive pattern in a layout view. The area, contacting the first conductive segments, of the first via has a square shape with a width 1 to 3 times of a width of the first conductive pattern. In some embodiments, the first via has a tapered shape with a width that decreases from a first width to a second width narrower than the first width. The first width of the first via is greater than width of the first conductive pattern. In some embodiments, the integrated circuit further includes a second conductive pattern extending parallel to the first conductive pattern in the first layer and configured to be a voltage terminal of the inverter; a second via coupled between the second conductive pattern; and a power rail pattern that is disposed in the second layer and configured to transmit a supply voltage to the second conductive pattern through the second via. The first via and the second via have a substantially same resistance value. In some embodiments, the second via has a tapered shape with a width that decreases from a first width to a second width narrower than the first width.

An integrated circuit is provided, including a first conductive pattern and a second conductive pattern that extend in a first direction; a first conductive segment and a first power rail pattern that extend in a second direction different from the first direction above the first and second conductive patterns; and a first via and a second via that extend in the second direction and have a substantially same resistance value. The first via couples the first conductive segment to a first conductive pattern to transmit an output signal from the integrated circuit. The second via couples the first power rail pattern to the second conductive pattern to receive a first supply voltage for the integrated circuit. In some embodiments, the second via occupies an area that is substantially the same as an area of the first via in a layout view. In some embodiments, the integrated circuit further includes a third conductive pattern extending parallel to the first and second conductive patterns; a second power rail pattern, wherein the first conductive segment is disposed between the first and second power rail patterns; and a third via coupling the second power rail pattern to the third conductive pattern to receive a second supply voltage different from the first supply voltage for the integrated circuit. The second and third vias occupy the same amount of area in a layout view. In some embodiments, the first and third vias have a substantially same resistance value. In some embodiments, the first via has a length along the second direction greater than a length of the first conductive segment along the second direction.

A method is provided and includes the following steps: forming multiple active areas extending in a first direction; forming multiple conductive patterns that cross over multiple active areas and extend in a second direction different from the first direction; and forming a first via extending in the first direction to exceed a first conductive pattern of multiple conductive patterns, wherein the first via directly contacts the first conductive pattern. The first via and the first conductive pattern are included in a structure configured as an output node of an integrated circuit. In some embodiments, the method further includes steps: forming a second via extending in the first direction to exceed a second conductive pattern of the conductive patterns; and forming a first conductive segment coupled to the second via to receive a supply voltage for the integrated circuit. The first and second vias have a substantially same resistance value. In some embodiments, the method further includes steps: forming a second conductive segment coupled to the first via and included in the structure configured as the output node of the integrated circuit. The second conductive segment has a width greater than a width of the first via along the second direction. In some embodiments, a width of the first via is about 3 times greater than widths of the conductive patterns. In some embodiments, the method further includes steps: forming a second via extending in the first direction; and forming a first conductive segment coupled to the second via to receive a supply voltage for the integrated circuit. The second via has a tapered shape with a width that decreases from a first width to a second width narrower than the first width. The first and second vias have a substantially same resistance value. In some embodiments, the method further includes steps: forming a second via included in a structure configured to receive a supply voltage for the integrated circuit. The first and second vias are formed with same materials.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An integrated circuit, comprising:
a first conductive pattern that is disposed in a first layer and configured as a terminal of an inverter;
at least one first conductive segment that is disposed in a second layer above the first layer and configured to transmit an output signal output from the inverter;
a first via contacting the first conductive pattern and the at least one first conductive segment to transmit the output signal, wherein an area, contacting the first conductive pattern, of the first via is smaller than an area, contacting the at least one first conductive segment, of the first via; and
a gate that is disposed in the first layer and adjacent to the first conductive pattern, wherein the gate and the first conductive pattern extend in a same direction.

2. The integrated circuit of claim 1, further comprising:
a plurality of active areas that extend in a first direction and are crossed over by the first conductive pattern,
wherein the at least one first conductive segment extends in the first direction, and the first conductive pattern extends in a second direction perpendicular to the first direction.

3. The integrated circuit of claim 2, wherein the first via includes a portion extending in the second direction and crossing over the first conductive pattern in a layout view.

4. The integrated circuit of claim 1, wherein the at least one first conductive segment comprises:
a plurality of first conductive segments that overlap the first conductive pattern in a layout view and extend in a first direction;
wherein the integrated circuit further comprises:
a second conductive segment extending in a second direction above the plurality of first conductive segments and coupled to the plurality of first conductive segments to transmit the output signal.

5. The integrated circuit of claim 4, wherein the area, contacting the plurality of first conductive segments, of the first via has a square shape.

6. The integrated circuit of claim 1, wherein the at least one first conductive segment comprises:
a plurality of first conductive segments that overlap the first conductive pattern in a layout view,
wherein the area, contacting the plurality of first conductive segments, of the first via has a square shape with a width 1 to 3 times of a width of the first conductive pattern.

7. The integrated circuit of claim 6, wherein the first via has a tapered shape with a width that decreases from a first width to a second width narrower than the first width,
wherein the first width of the first via is greater than the width of the first conductive pattern.

8. The integrated circuit of claim 1, further comprising:
a second conductive pattern extending parallel to the first conductive pattern in the first layer and configured to be a voltage terminal of the inverter;
a second via coupled to the second conductive pattern; and
a power rail pattern that is disposed in the second layer and configured to transmit a supply voltage to the second conductive pattern through the second via,
wherein the first via and the second via have a substantially same resistance value.

9. The integrated circuit of claim 8, wherein the second via has a tapered shape with a width that decreases from a first width to a second width narrower than the first width.

10. An integrated circuit, comprising:
a first conductive pattern and a second conductive pattern that extend in a first direction;
a first conductive segment and a first power rail pattern that extend in a second direction different from the first direction above the first and second conductive patterns; and
a first via and a second via that extend in the second direction and have a substantially same resistance value,
wherein the first via couples the first conductive segment to the first conductive pattern to transmit an output signal from the integrated circuit, and
the second via couples the first power rail pattern to the second conductive pattern to receive a first supply voltage for the integrated circuit.

11. The integrated circuit of claim 10, wherein the second via occupies an area that is substantially the same as an area of the first via in a layout view.

12. The integrated circuit of claim 10, further comprising:
a third conductive pattern extending parallel to the first and second conductive patterns;
a second power rail pattern, wherein the first conductive segment is disposed between the first and second power rail patterns; and
a third via coupling the second power rail pattern to the third conductive pattern to receive a second supply voltage different from the first supply voltage for the integrated circuit,
wherein the second and third vias occupy the same amount of area in a layout view.

13. The integrated circuit of claim 12, wherein the first and third vias have a substantially same resistance value.

14. The integrated circuit of claim 10, wherein the first via has a length along the second direction greater than a length of the first conductive segment along the second direction.

15. An integrated circuit, comprising:
a plurality of conductive patterns that cross over a plurality of active areas extending in a first direction, wherein the plurality of conductive patterns extend in a second direction different from the first direction; and
a first via extending in the first direction to exceed a first conductive pattern of the plurality of conductive patterns, wherein the first via directly contacts the first conductive pattern;
wherein the first via and the first conductive pattern are included in a structure configured as an output node of the integrated circuit.

16. The integrated circuit of claim 15, further comprising:
a second via extending in the first direction to exceed a second conductive pattern of the plurality of conductive patterns; and
a first conductive segment coupled to the second via to receive a supply voltage,
wherein the first via and the second via have a substantially same resistance value.

17. The integrated circuit of claim 16, further comprising:
a second conductive segment coupled to the first via and included in the structure configured as the output node of the integrated circuit, wherein the second conductive segment has a width greater than a width of the first via along the second direction.

18. The integrated circuit of claim 15, wherein a width of the first via is about 3 times greater than widths of the plurality of conductive patterns.

19. The integrated circuit of claim 15, further comprising:
a second via extending in the first direction; and
a first conductive segment coupled to the second via to receive a supply voltage,
wherein the second via has a tapered shape with a width that decreases from a first width to a second width narrower than the first width,
wherein the first via and the second via have a substantially same resistance value.

20. The integrated circuit of claim 15, further comprising:
a second via included in a structure configured to receive a supply voltage for the integrated circuit,
wherein the first and second vias are of same materials.

* * * * *